US006401230B1

(12) United States Patent
Ahanessians et al.

(10) Patent No.: US 6,401,230 B1
(45) Date of Patent: Jun. 4, 2002

(54) METHOD OF GENERATING CUSTOMIZED MEGAFUNCTIONS

(75) Inventors: Razmik Ahanessians, Campbell; Marcel A. LeBlanc, Sunnyvale, both of CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/243,195

(22) Filed: Feb. 1, 1999

Related U.S. Application Data
(60) Provisional application No. 60/110,894, filed on Dec. 4, 1998.

(51) Int. Cl.⁷ .............................................. G06F 17/50
(52) U.S. Cl. ............................................. 716/1; 716/18
(58) Field of Search ................................. 716/1, 16, 17, 716/18

(56) References Cited

U.S. PATENT DOCUMENTS

| | | | | |
|---|---|---|---|---|
| 6,023,565 A | * | 2/2000 | Lawman et al. ................ | 716/1 |
| 6,026,220 A | * | 2/2000 | Cleereman et al. ............. | 716/3 |
| 6,120,549 A | * | 9/2000 | Goslin et al. .................. | 703/20 |
| 6,173,245 B1 | * | 1/2001 | Karchmer et al. ............. | 703/22 |
| 6,216,258 B1 | * | 4/2001 | Mohan et al. ................. | 716/17 |

OTHER PUBLICATIONS

Draft Developer's Documentation sent to Developers with Sample Code For Testing, Dec. 19, 1997. ("MegaWizard® Plug–In Manager–Megafunction Wizards Information Exchange Requirements").
Press Release from Altera Corporation, Altera's Mega Wizard Plug–Ins Offer the First Too–Independent Parameterized Logic Cores, Feb. 2, 1998.

"A Developers Guide to the Design of MegaWizard® Megafunction Wizards," Documentation for Developers Provided with Final Product Release, Jun. 30, 1998.
"Mega Wizard Plug–Ins," provided on Altera Corporation's World Wide Web Home Page (www.altera.com), prior to Jan. 11, 1999.
"Altera Megafunctions," provided on Altera Corporation's World Wide Web Home Page (www.altera.com), prior to Jan. 11, 1999.
"AMPP Megafunction: Telephone Tone Generation Megafunction," Provided on Altera Corporation's World Wide Web Home Page (www.altera.com), prior to Jan. 11, 1999.
"Introduction to Megafunctions," provided on Altera Corporation's World Wide Web Home Page (www.altera.com), prior to Jan. 11, 1999.
PowerPoint® presentation describing "Megafunctin Wizard" functionality made Nov. 1997.

* cited by examiner

*Primary Examiner*—Vuthe Siek
(74) *Attorney, Agent, or Firm*—Beyer Weaver & Thomas, LLP; Dean E. Wolf, Esq.

(57) ABSTRACT

Software modules referred to as "plug-ins" associate with megafunctions written in any Hardware Description Language to provide rich parameterization. To the user, the plug-ins present a "wizard" interface allowing selection or setting of any number of important parameters for a particular megafunction. To the design compiler, parameterized megafunctions instantiated via a plug-in appear non-parameterized functions of a type that may be easily handled (by, for example, VHDL and Verilog compilers). Plug-ins "plug into" a compiler or an application associated with the compiler, sometimes referred to as a "plug-in manager." The plug-in manager creates compilable files from user-defined parameter settings passed by the plug-ins.

48 Claims, 17 Drawing Sheets

| Megafunction | Variation File |
|---|---|
| -- megafunction - FIFO | my-fifo-instance: ⟋ 513 |
| 511 ⟋ PARAMETERS<br>( <br>   BUFFER_DEPTH = 32<br>   INPUT_BUS_WIDTH<br>); | FIFO WITH<br>(<br>   INPUT_BUS_WIDTH = 16<br>) |
| SUBDESIGN FIFO<br>(<br>   .<br>   .<br>   .<br>   . | |

Figure 5

```
GENERATION: STANDARD        ← 603
VERSION: WM1.0
MODULE: SCFIFO

PRIVATE: Width NUMERIC "8"
. . . .

CONSTANT: LPM_WIDTH NUMERIC "8"         ← 605
CONSTANT: LPM_NUMWORDS NUMERIC "256"
CONSTANT: LPM_SHOWAHEAD STRING "OFF"
CONSTANT: USE_EAB STRING "ON"

USED_PORT: data 0 0 8 0 INPUT NODEFVAL data[7..0]
USED_PORT: q 0 0 8 0 OUTPUT NODEFVAL q[7..0]
USED_PORT: wrreq 0 0 0 0 INPUT NODEFVAL wrreq          607
USED_PORT: rdreq 0 0 0 0 INPUT NODEFVAL rdreq
USED_PORT: clock 0 0 0 0 INPUT NODEFVAL clock
USED_PORT: full 0 0 0 0 OUTPUT NODEFVAL full
USED_PORT: empty 0 0 0 0 OUTPUT NODEFVAL empty
USED_PORT: usedw 0 0 8 0 OUTPUT NODEFVAL usedw[7..0]

CONNECT: @data 0 0 8 0 data 0 0 8 0
CONNECT: q 0 0 8 0 @q 0 0 8 0
CONNECT: @wrreq 0 0 0 0 wrreq 0 0 0 0          609
CONNECT: @rdreq 0 0 0 0 rdreq 0 0 0 0
CONNECT: @clock 0 0 0 0 clock 0 0 0 0
CONNECT: full 0 0 0 0 @full 0 0 0 0
CONNECT: empty 0 0 0 0 @empty 0 0 0 0
CONNECT: usedw 0 0 8 0 @usedw 0 0 8 0

SYMBOL: BOX 160 144 69 127 Arial,10           611
SYMBOL: LINE 16 128 144 128 SOLID THIN
SYMBOL: LINE 144 128 144 16 SOLID THIN
SYMBOL: LINE 144 16 16 16 SOLID THIN
SYMBOL: LINE 16 16 16 128 SOLID THIN
SYMBOL: LINE 16 36 144 36 SOLID THIN
SYMBOL: TEXT "8 bits x 256 words" 68 16 HORIZ Arial,7
SYMBOL: PINSTUB 0 112 IN data[7..0] 20 105 "data[7..0]" HORIZ Arial,8
SYMBOL: LINE 0 112 16 112 SOLID THICK
SYMBOL: PINSTUB 0 88 IN wrreq 20 81 "wrreq" HORIZ Arial,8
SYMBOL: LINE 0 88 16 88 SOLID THIN
SYMBOL: PINSTUB 0 72 IN rdreq 20 65 "rdreq" HORIZ Arial,8
SYMBOL: LINE 0 72 16 72 SOLID THIN
SYMBOL: PINSTUB 0 48 IN clock 26 41 "clock" HORIZ Arial,8
SYMBOL: LINE 0 48 16 48 SOLID THIN
SYMBOL: LINE 16 54 22 48 SOLID THIN
SYMBOL: LINE 22 48 16 42 SOLID THIN
SYMBOL: PINSTUB 160 112 OUT q[7..0] 111 105 "q[7..0]" HORIZ Arial,8
SYMBOL: LINE 160 112 144 112 SOLID THICK
SYMBOL: PINSTUB 160 88 OUT full 127 81 "full" HORIZ Arial,8
SYMBOL: LINE 160 88 144 88 SOLID THIN
SYMBOL: PINSTUB 160 72 OUT empty 112 65 "empty" HORIZ Arial,8
SYMBOL: LINE 160 72 144 72 SOLID THIN
SYMBOL: PINSTUB 160 56 OUT usedw[7..0] 83 49 "usedw[7..0]" HORIZ Arial,8
SYMBOL: LINE 160 56 144 56 SOLID THICK
```

Figure 6B

```
-- ================================================================
-- File Name: fifo1.vhd
-- Megafunction Name(s):
--                  SCFIFO
-- ================================================================
-- ****************************************************************
-- THIS IS A WIZARD GENERATED FILE.
-- ****************************************************************

--      Copyright (C) 1988-1998 Altera Corporation

LIBRARY ieee;
USE ieee.std_logic_1164.all;
LIBRARY lpm;
USE lpm.lpm_components.all;

ENTITY fifo1 IS
        PORT
        (
                data       : IN STD_LOGIC_VECTOR (7 DOWNTO 0);
                wrreq      : IN STD_LOGIC ;
                rdreq      : IN STD_LOGIC ;
                clock      : IN STD_LOGIC ;
                q          : OUT STD_LOGIC_VECTOR (7 DOWNTO 0);
                full       : OUT STD_LOGIC ;
                empty      : OUT STD_LOGIC ;
                usedw      : OUT STD_LOGIC_VECTOR (7 DOWNTO 0)
        );
END fifo1;

ARCHITECTURE SYN OF fifo1 IS

SIGNAL sub_wire0   : STD_LOGIC_VECTOR (7 DOWNTO 0);
        SIGNAL sub_wire1   : STD_LOGIC ;
        SIGNAL sub_wire2   : STD_LOGIC_VECTOR (7 DOWNTO 0);
        SIGNAL sub_wire3   : STD_LOGIC ;

COMPONENT SCFIFO
        GENERIC (
                LPM_WIDTH          : POSITIVE;
                LPM_NUMWORDS              : POSITIVE;
                LPM_SHOWAHEAD             : STRING;
                USE_EAB            : STRING
        );
        PORT (
                        usedw : OUT STD_LOGIC_VECTOR (7 DOWNTO 0);
                        rdreq : IN STD_LOGIC ;
                        empty : OUT STD_LOGIC ;
                        clock : IN STD_LOGIC ;
                        q     : OUT STD_LOGIC_VECTOR (7 DOWNTO 0);
                        wrreq : IN STD_LOGIC ;
                        data  : IN STD_LOGIC_VECTOR (7 DOWNTO 0);
                        full  : OUT STD_LOGIC
        );
        END COMPONENT;
```

Figure 8C

```
BEGIN
    usedw   <= sub_wire0(7 DOWNTO 0);
    empty   <= sub_wire1;
    q       <= sub_wire2(7 DOWNTO 0);
    full    <= sub_wire3;

SCFIFO_component : SCFIFO
    GENERIC MAP (
        LPM_WIDTH => 8,
        LPM_NUMWORDS => 256,
        LPM_SHOWAHEAD => "OFF",
        USE_EAB => "ON"
    )
    PORT MAP (
        rdreq => rdreq,
        clock => clock,
        wrreq => wrreq,
        data => data,
        usedw => sub_wire0,
        empty => sub_wire1,
        q => sub_wire2,
        full => sub_wire3
    );

END SYN;

-- ================================================================
-- CNX file retrieval info
-- ================================================================
-- Retrieval info: PRIVATE: Width NUMERIC "8"
-- Retrieval info: PRIVATE: Depth NUMERIC "256"
-- Retrieval info: PRIVATE: Clock NUMERIC "0"
-- Retrieval info: PRIVATE: Full NUMERIC "1"
-- Retrieval info: PRIVATE: Empty NUMERIC "1"
-- Retrieval info: PRIVATE: UsedW NUMERIC "1"
-- Retrieval info: PRIVATE: AlmostFull NUMERIC "0"
-- Retrieval info: PRIVATE: AlmostEmpty NUMERIC "0"
-- Retrieval info: PRIVATE: AlmostFullThr NUMERIC "-1"
-- Retrieval info: PRIVATE: AlmostEmptyThr NUMERIC "-1"
-- Retrieval info: PRIVATE: sc_aclr NUMERIC "0"
-- Retrieval info: PRIVATE: sc_sclr NUMERIC "0"
-- Retrieval info: PRIVATE: rsFull NUMERIC "0"
-- Retrieval info: PRIVATE: rsEmpty NUMERIC "1"
-- Retrieval info: PRIVATE: rsUsedW NUMERIC "0"
-- Retrieval info: PRIVATE: wsFull NUMERIC "1"
-- Retrieval info: PRIVATE: wsEmpty NUMERIC "0"
-- Retrieval info: PRIVATE: wsUsedW NUMERIC "0"
-- Retrieval info: PRIVATE: dc_aclr NUMERIC "0"
-- Retrieval info: PRIVATE: LegacyRREQ NUMERIC "1"
-- Retrieval info: PRIVATE: LE_BasedFIFO NUMERIC "0"
```

Figure 8D

```
// ================================================================
// File Name: fifo1.v
// Megafunction Name(s):
//              SCFIFO
// ================================================================
// ****************************************************************
// THIS IS A WIZARD GENERATED FILE.
// ****************************************************************

//      Copyright (C) 1988-1998 Altera Corporation module fifo1 (
        data,
        wrreq,
        rdreq,
        clock,
        q,
        full,
        empty,
        usedw);

input   [7:0]   data;
        input           wrreq;
        input           rdreq;
        input           clock;
        output          [7:0]   q;
        output                  full;
        output                  empty;
        output          [7:0]   usedw;

wire    [7:0]   sub_wire0;
        wire    sub_wire1;
        wire    [7:0]   sub_wire2;
        wire    sub_wire3;
        wire    [7:0]   usedw = sub_wire0[7:0];
        wire    empty = sub_wire1;
        wire    [7:0]   q = sub_wire2[7:0];
        wire    full = sub_wire3;

SCFIFO          SCFIFO_component (
                                .rdreq (rdreq),
                                .clock (clock),
                                .wrreq (wrreq),
                                .data (data),
                                .usedw (sub_wire0),
                                .empty (sub_wire1),
                                .q (sub_wire2),
                                .full (sub_wire3));
        defparam
                SCFIFO_component.LPM_WIDTH = 8,
                SCFIFO_component.LPM_NUMWORDS = 256,
                SCFIFO_component.LPM_SHOWAHEAD = "OFF",
                SCFIFO_component.USE_EAB = "ON";

endmodule

// ================================================================
// CNX file retrieval info
// ================================================================
```

Figure 8E

```
--    Copyright (C) 1988-1998 Altera Corporation

FUNCTION fifo1
(
      data[7..0],
      wrreq,
      rdreq,
      clock
)

RETURNS (
      q[7..0],
      full,
      empty,
      usedw[7..0]
);
;
```

Figure 8F

```
--    Copyright (C) 1988-1998 Altera Corporation component fifo1
      PORT
      (
            data       : IN  STD_LOGIC_VECTOR (7 DOWNTO 0);
            wrreq      : IN  STD_LOGIC ;
            rdreq      : IN  STD_LOGIC ;
            clock      : IN  STD_LOGIC ;
            q          : OUT STD_LOGIC_VECTOR (7 DOWNTO 0);
            full       : OUT STD_LOGIC ;
            empty      : OUT STD_LOGIC ;
            usedw      : OUT STD_LOGIC_VECTOR (7 DOWNTO 0)
      );
end component;
```

Figure 8G

METHOD OF GENERATING CUSTOMIZED MEGAFUNCTIONS

CROSS-REFERENCE TO RELATED APPLICATIONS

This application claims priority of provisional U.S. patent application Ser. No. 60/110,894, filed Dec. 4, 1998, entitled "A LANGUAGE-INDEPENDENT METHOD TO GENERATE CUSTOMIZED MEGAFUNCTIONS" which is incorporated by reference.

COPYRIGHT NOTICE

A portion of the disclosure of this patent document contains material which is subject to copyright protection. The copyright owner has no objection to the facsimile reproduction by any one of the patent disclosure, as it appears in the Patent and Trademark Office patent files or records, but otherwise reserves all copyright rights whatsoever.

BACKGROUND OF THE INVENTION

The present invention relates to computer-assisted methods and apparatus for generating electronic designs such as designs for digital integrated circuits. More specifically, the invention relates to improvements in the usefulness of "off-the-shelf" functional blocks for electronic designs.

Present Electronic Design Automation (EDA) systems for the design of electronic circuits, sometimes referred to as ECAD or electronic CAD systems, assist in the design of electronic circuits by providing a user with a set of software tools running on a digital computer. Such systems are provided with various architectures. In one widely used architecture, five major software program functions run on the ECAD system: a schematic editor, a compiler, a simulator, a verifier, and a layout program. Sometimes, the layout program forms part of the compiler. The schematic editor program allows the user of the system to enter and/or modify a schematic diagram of an electronic design using the display screen, generating a net list (summary of connections between components) in the process. An equivalent method for entering an electronic design involves providing a description of the design in a Hardware Description Language (HDL). Examples of HDLs include Verilog and VHDL. The syntax of a VHDL description is described in IEEE Standard VHDL Language Reference Manual (IEEE Std 1076-1987), which is incorporated herein by reference for all purposes and in its entirety. Like the schematic representation, the HDL representation also provides a net list.

The compiler takes the net list as an input, and using a component database puts all of the information necessary for layout, verification, and simulation into an object file or files. The verifier checks the input design (schematic or HDL) for design errors, such as multiple outputs connected together, overloaded signal paths, etc. and generates error indications if any such design problems exist. The simulator takes the object file(s) and simulation models, and generates a set of simulation results, acting on instructions, initial conditions, and input signal values provided to it either in the form of a file or user input.

Often a designer creates an electronic design from various functional blocks. For example, the designer may first create a functional block for a particular filter, then create a functional block for a buffer, and then one for a memory block, and so on. With the component functional blocks in hand, the designer makes the necessary connections between them to create the larger design, a project. It is often convenient to design reusable functional blocks for use in multiple electronic designs/projects. For example, a functional block that performs the computationally intensive steps of a fast Fourier transform or an inverse fast Fourier transform may find use in many integrated circuits (e.g., circuits for encoding and decoding audio and video information digitally and analyzing data from various scientific instruments). Various individuals and groups developing relevant electronic designs have created reusable functional blocks for fast Fourier transforms and inverse fast Fourier transforms.

A user simply inserts the functional block into his or her larger electronic design, makes the necessary connections to other features of the larger electronic design, and compiles the entire design per the normal procedure. The resulting compiled electronic design includes the off-the-shelf functional block integrated with other components of the design in a compiled form. This design can be then used to program a programmable logic device or layout an application specific integrated circuit (ASIC), for example. Such predefined off-the-shelf functional blocks are given various names in the EDA industry. Examples include megafunctions, cores, macrofunctions, and the like. For convenience, any such functional blocks will often be referred to herein as "megafunctions" or simply "functional blocks."

The underlying design associated with a megafunction will be defined by various parameters. Examples include bus widths, buffer sizes, memory array dimensions, etc. Many megafunctions contain rigidly set values for the associated parameters. For example, a buffer functional block may require a buffer depth of 16 words and a buffer width of 32 bits. Unfortunately, this rigidity limits wide spread use of such megafunctions. While many users may need a particular type of buffer, only a small fraction of them can make use of functional blocks that specify a particular bus width or buffer size. Functional blocks having such rigidly set specifications are frequently referred to as "non-parameterized" functional blocks or megafunctions.

To address the difficulty of non-parameterized megafunctions, "parameterized" megafunctions have been developed. Typically, these megafunctions take advantage of the ability of some Hardware Description Languages to encode parameters for which the user/developer can specify values. Collections or libraries of parameterized megafunctions are available. One example is the library of parameterized modules ("LPM") developed under the guidance of the EDIF association. Examples of members of the library include adders, multipliers, comparators, etc. Generally, these functions are rather low level.

Unfortunately, there are various problems with these parameterized megafunctions. For many of the various Hardware Description Languages available, parameterization is a poorly developed feature. This may be because most Hardware Description Languages were designed for simulation, not design entry and synthesis. As a result, parameterization is not supported universally and fully in many Hardware Description Languages. The proprietary Hardware Description Language, AHDL, used to design programmable logic devices of Altera Corporation (San Jose, Calif.), does fully support parameterization. Thus, parameterized megafunctions written in AHDL may have a rich compliment of parameterization. Unfortunately, similar megafunctions written in other Hardware Description Languages such as VHDL or Verilog, typically cannot have the rich compliment of parameterization available in AHDL megafunctions. Unfortunately, non-proprietary Hardware Description Languages such as VHDL and Verilog are widely used in the industry.

What is needed therefore is an improved method of providing flexibility to a user in selecting parameters and other options associated with megafunctions. For example, it would be desirable to have a mechanism that allowed the rich parameterization available with AHDL to be available for use with other Hardware Description Languages, so that megafunctions written in such other languages could be fully parameterized.

SUMMARY OF THE INVENTION

The present invention provides software modules, referred to herein as "plug-ins," which associate with megafunctions written in any Hardware Description Language to provide rich parameterization. To the user, the plug-ins present an interface (sometimes referred to as a "wizard") allowing selection or setting of any number of important parameters for a particular megafunction. To the design compiler, parameterized megafunctions instantiated via a plug-in appear to be a non-parameterized functions of a type that may be easily handled (by, for example, VHDL and Verilog compilers). Plug-ins "plug into" a compiler or an application associated with the compiler, sometimes referred to as a "plug-in manager." The plug-in manager creates compilable files from user-defined parameter settings passed by the plug-ins.

One aspect of the invention pertains to the operation of a plug-in or related application for setting options for a parameterized functional block of an electronic design. The operation may be characterized as follows: (a) prompting a user, via a user interface, to select settings for one or more options; and (b) packaging settings selected by the user in a file that can be compiled or used to generate a compilable functional block for the electronic design. Note that sometimes the option settings must be provided to allow the parameterized functional block to be compiled to an unambiguous circuit block forming part of the electronic design. In other cases, the functional block can be compiled, but the user is constrained to use default parameter settings unless presented with options via a method such as this invention. After packaging the settings, the plug-in system may provide the file to a compiler or an application that uses the settings contained in the file to generate the compilable functional block.

Usually, though not necessarily, the parameterized functional block is provided in a Hardware Description Language such as VHDL, Verilog, or AHDL. The HDL code for the parameterized functional block contains a parameter block identifying parameters that can be set to specific values by the user. The setting options may be of various types. Examples include parameter values (e.g., bus widths, buffer sizes, etc. from an HDL parameter block), the identification of which ports to use in the parameterized functional block, and connections between two or more functional blocks. Further, the user interface may allow the user to select one of two or more parameterized functional blocks that are interchangeable in the electronic design. For example, the user may be given the option of choosing one buffer with a single clock for synchronizing reading and writing or a second buffer with separate clocks for read and write operations.

The packaged user-selected settings for the parameterized functional block may be provided in a particular format required by the compiler or a manager application associated with the compiler. Such format may require hand shaking information for communications between a first entity (e.g., a plug-in) that creates the file and a second entity (e.g., the compiler or manager application) that receives the file. The file format may also allow for data specifying a symbolic representation of the parameterized functional block and associated user selected settings. Such symbolic representation may be a schematic that can be edited by an EDA schematic editor, for example.

Another aspect of the invention pertains to the operation of a plug-in manager or similar application. The operation involves providing a "compilable variation" of parameterized functional blocks for electronic designs. This compilable variation, when used with associated parameterized functional blocks, allow the compiler to create unambiguous circuit blocks forming parts of electronic designs. Typically, both the variations (typically provided in "variation files") and the functional blocks are embodied as HDL code. Without the information provided in a variation file, the parameterized functional block code might not be compilable to an unambiguous circuit design.

A plug-in manager should be able to handle information from many different plug-ins, each associated with different functional blocks. To emphasize that the manager can handle various plug-ins, the operation of the manager or related application may, in accordance with this invention, be characterized as follows: (a) receiving a first set of option settings containing user-selected settings for a first parameterized functional block; (b) generating a first compilable variation file specifying the first set of option settings; (c) receiving a second set of option settings containing user-selected settings for a second parameterized functional block; and (d) generating a second compilable variation file specifying the second set of option settings. When the first variation file is compiled with the first parameterized functional block, a first unambiguous circuit block is formed and when the second variation file is compiled with the second parameterized functional block, a second unambiguous circuit block is formed. Typically, the manager handles the first and second sets as separate projects, rather than via batch processing.

As mentioned, the variation file is typically provided as HDL code. Thus, it includes the user-specified options for a functional block in appropriate HDL format. The variation file must also tell the compiler how it is associated with the underlying or base parameterized functional block file. To this end, the variation file identifies the associated parameterized functional block (typically by name) and maps variables (by name) from the variation file to the parameterized functional block. The manager may generate, in addition to the variation file, a "declaration file" specifying an interface for the generated variation of the parameterized functional block. Many conventional compilers require such declaration files.

Another aspect of the invention pertains to apparatus for implementing the plug-ins and plug-in managers of this invention. Such apparatus may take the form of a computer or computational system. It may contain one or more processors configurable by instructions and/or data provided from one or more memory elements coupled to at least one processor. In the case of a plug-in, the apparatus should also provide a user interface (for providing selection options in the form of a wizard for example) via a display coupled to at least one processor. Often the apparatus will include one or more plug-ins, a plug-in manager and a compiler. The plug-in manager and the compiler may be tightly integrated. The apparatus may additionally house or have easy access to a library of parameterized functional blocks. Note that any of these entities may exist as a stand-alone functionality.

These and other features and advantages of the present invention will be described in detail below with reference to the associated drawings.

BRIEF DESCRIPTION OF THE DRAWINGS

FIG. 5 is an illustration of partial AHDL code for a parameterized megafunction (FIFO) and AHDL code for a variation file including user-specified parameter values for the megafunction, FIFO.

FIG. 6B presents a sample file containing lines of data appearing in an output parameter file for a FIFO megafunction.

FIGS. 8C and 8D present a sample file containing VHDL code for a variation on a FIFO megafunction.

FIG. 8E presents a sample file containing Verilog code for a variation on a FIFO megafunction.

FIG. 8F presents a sample declaration file containing AHDL compatible statements for the above-mentioned variation on a FIFO megafunction.

FIG. 8G presents a sample declaration file containing VHDL compatible statements for the above-mentioned variation on a FIFO megafunction.

DETAILED DESCRIPTION OF THE PREFERRED EMBODIMENTS

Figure 1:
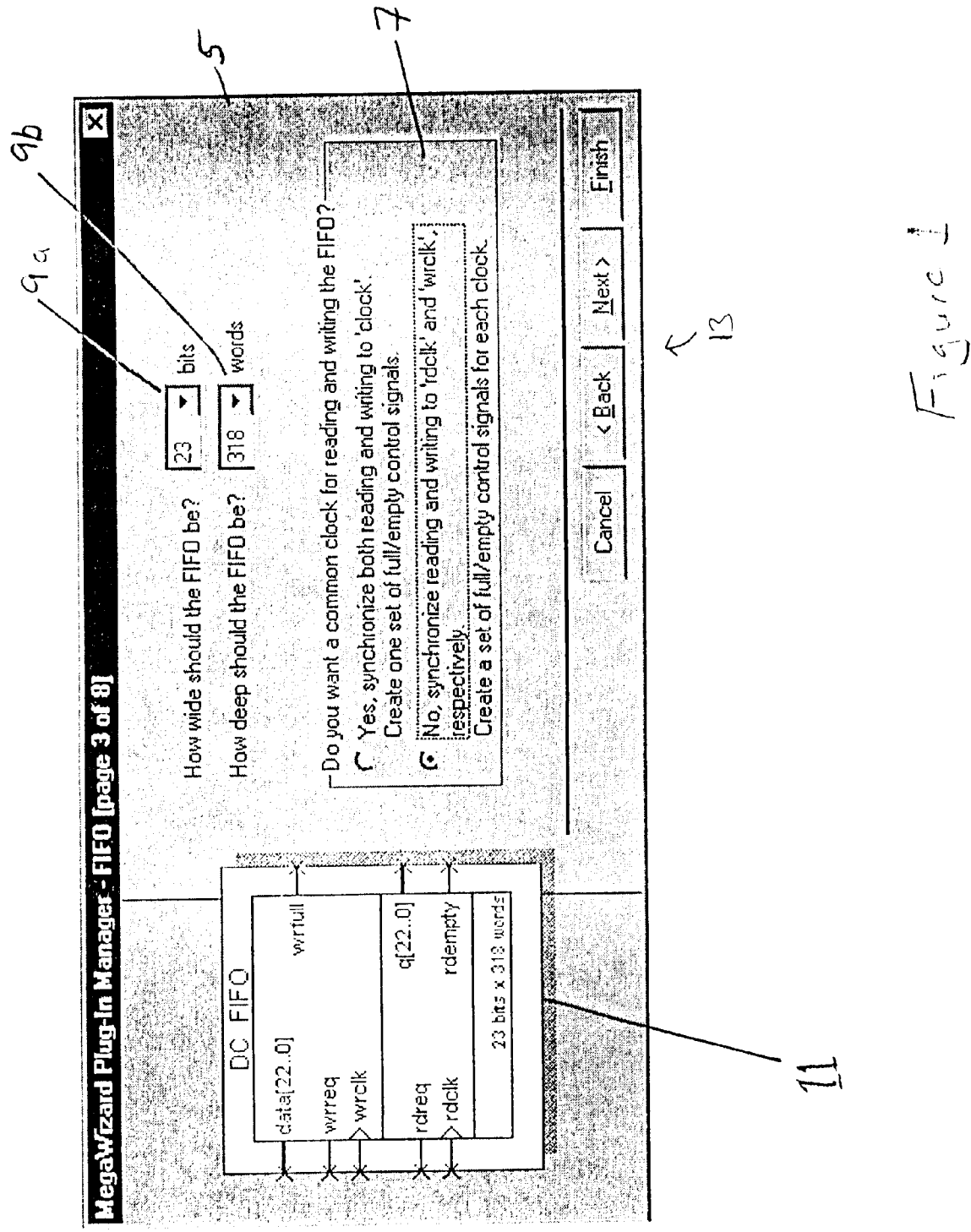
FIG. 1 is an illustration of a window presented to a user via a graphical user interface in accordance with one embodiment of this invention.

FIG. 1 presents an example window from a graphical user interface that might be presented to a user/developer who uses a plug-in of this invention. The plug-in associated with a particular megafunction (a FIFO buffer in this case) provides a wizard that prompts the user/developer to specify particular values for parameters that may be used by the megafunction. A wizard is generally any software that assists a user in completing a task such as filling out a form or template. Here, the wizard presents the user with options for customizing a megafunction. A well-designed wizard presents the options to the user in a logical order and in pertinent, easy to understand terms.

As shown in FIG. 1, a user's computer display will present a window 5 during use of the plug-in associated with a megafunction. In this case, the user would have already selected the associated megafunction for use in his or her design. At some point, the user or the system launches the plug-in and thereby initiates the wizard functionality. That functionality is manifest by one or more windows that give the user/developer the option of setting certain parameters associated with the megafunction.

In this case, the megafunction is a DC FIFO buffer. Note that window 5 gives the user/developer the option of choosing one of two types of FIFO buffers, distinguished by how read and write operations to the buffer are synchronized. Specifically, a radio button block 7 allows the user to click, and thereby select one of the two options. Note that these two options may actually represent two distinct megafunctions, each made available to the user/developer through the same plug-in.

Dialog box 5 also includes two pull-down menus, 9a and 9b which allow the user to specify the width and depth, respectively, of the FIFO buffer. Further, window 5 includes a symbol representation 11 that presents the parameterized megafunction in a schematic form that depicts the user selected parameter values.

Finally, window 5 includes four buttons 13. These buttons allow the user/developer to cancel the process, move to a previous page of the wizard, move to a next page of the wizard, and complete the use of the wizard. It may be convenient in some cases to present the wizard options in multiple pages (separate control windows). Another page of the FIFO buffer wizard might, for example, give the user/developer the option of specifying the bus width to the FIFO buffer. To move between these various pages of the wizard, the user simply clicks on the "back" or "next" buttons. When the user is satisfied with his or her selections for the megafunction, he or she selects the "finish" button. This causes the plug-in to package the user's settings and provide them to a plug-in manager that further processes the user selections and makes them available to a compiler.

Figure 2:
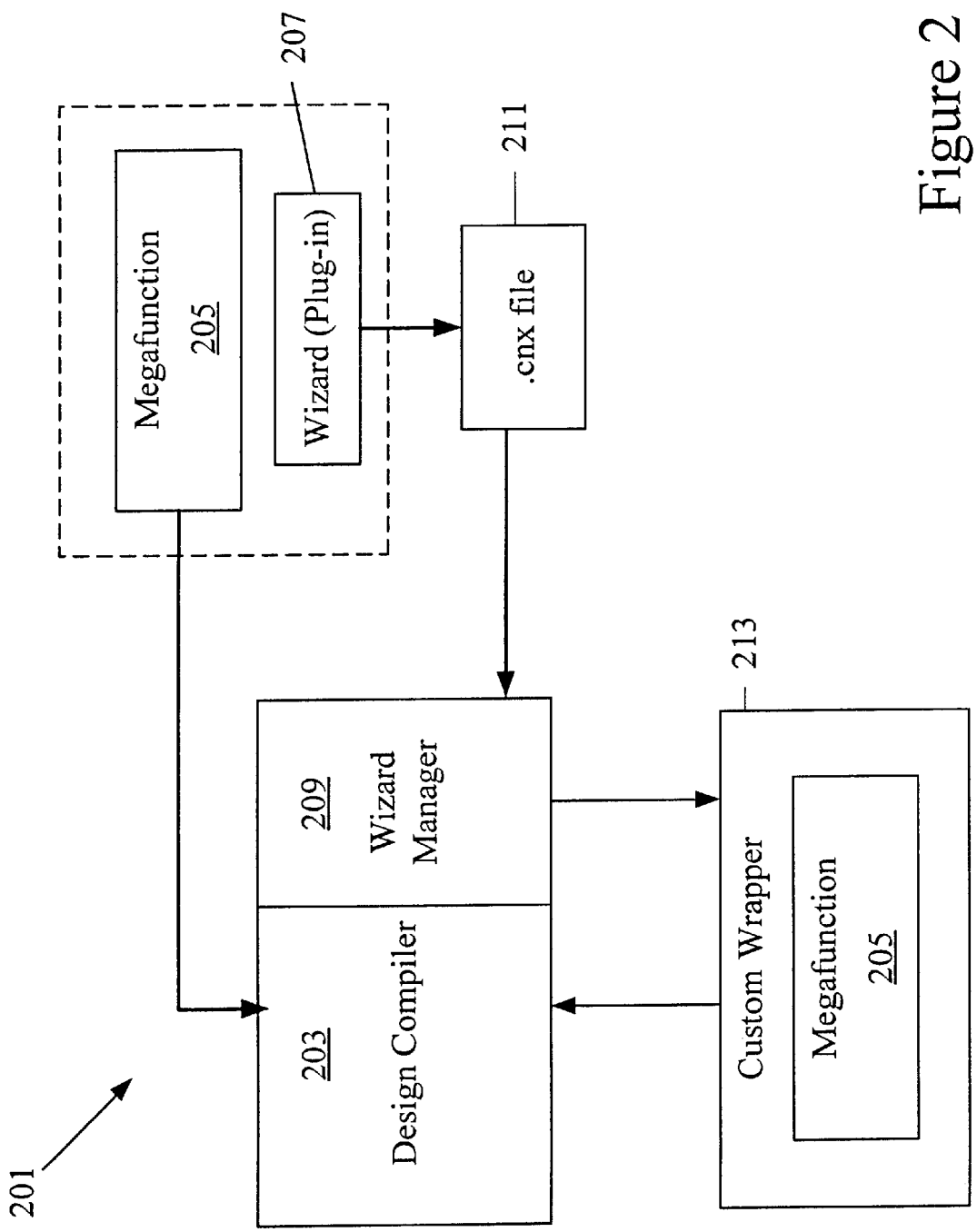
FIG. 2 is a block diagram of a system including a plug-in, a plug-in manager, and a compiler.

FIG. 2 presents a system 201 for using a plug-in and associated wizard interface in accordance with one embodiment of this invention. As shown, system 201 includes an EDA environment 203 including a compiler that compiles user designs comprising Hardware Description Language schematic blocks, timing constraints, floor plans, etc. EDA environment 203 may make use of megafunctions such as megafunction 205 during compilation of a user's design. For this to occur, the user must some how specify that megafunction 205 is integrated in his or her design.

In accordance with this invention, megafunction 205 is associated with a wizard plug-in 207 that presents the user/developer with various options for assigning values to pertinent parameters or otherwise constraining the functioning of megafunction 205. As noted above, a plug-in such as plug-in 207 may present a graphical user interface such as window 5 depicted in FIG. 1. Plug-in 207 (and all other suitably designed plug-ins) plug into a plug-in manager 209. Manager 209 is able to launch the wizard associated with plug-in 207 when a user/developer makes use of megafunction 205. It may accomplish this by locating the appropriate plug-in for a selected megafunction (plug-in 207 for megafunction 205 in this example) in the user's file system.

During operation, the wizard associated with plug-in 207 presents the user/developer with various options for constraining megafunction 205. The user's selections are saved during the process and packaged in a "parameter file" 211 (denoted by the extension ".cnx" in this example) when the user finishes the process. File 211 may include parameter information, custom symbol information, connection information, and the like. The custom symbol information may specify the appearance of the symbol for a schematic editor used by environment 203. Note that many design environments allow users to edit their designs with a schematic editing tool operating on a schematic depiction of the design in progress. The custom symbol information for the FIFO buffer shown in FIG. 1 may include symbol 11. The connection information in parameter file 211 specifies the user-selected types of connections to various ports of megafunction 205. For example, file 211 may specify that a port A of megafunction 205 is connected to a bus Z and that a port B of megafunction 205 is set to a particular constant value signal.

Parameter file 211 is provided to plug-in manager 209, which takes that information and creates a "custom variation file" 213 associated with megafunction 205. Essentially, custom variation file 213 is a top-level design file that may be viewed as enveloping megafunction 205. Custom variation file 213 houses (typically in HDL format) all the parameters that the user selected with the graphical user interface with the wizard. From the perspective of design environment 203, file 213 appears to be a non-parameterized function that it can handle with ease.

Note that in this example plug-in manager 209 is tightly integrated with EDA environment 203. This need not be the case, however, as manager 209 may be provided as a separate "stand-alone" application design to run in conjunction with a particular design environment.

Figure 3A:
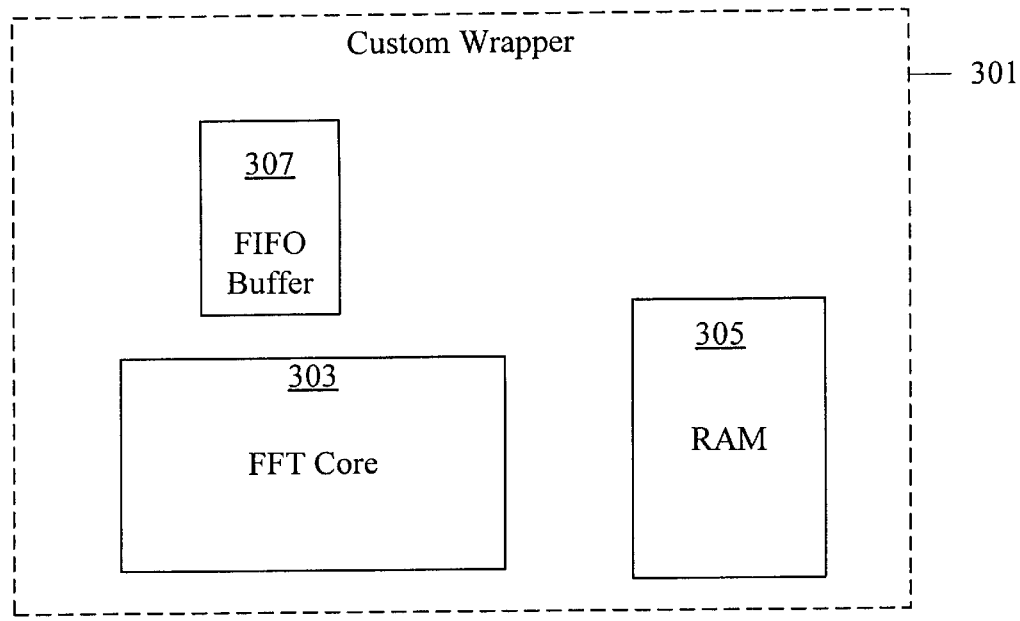
FIG. 3A is a block diagram depicting a variation file for a design sub-system including a Fast Fourier Transform core, a memory block, and a buffer.
Figure 3B:
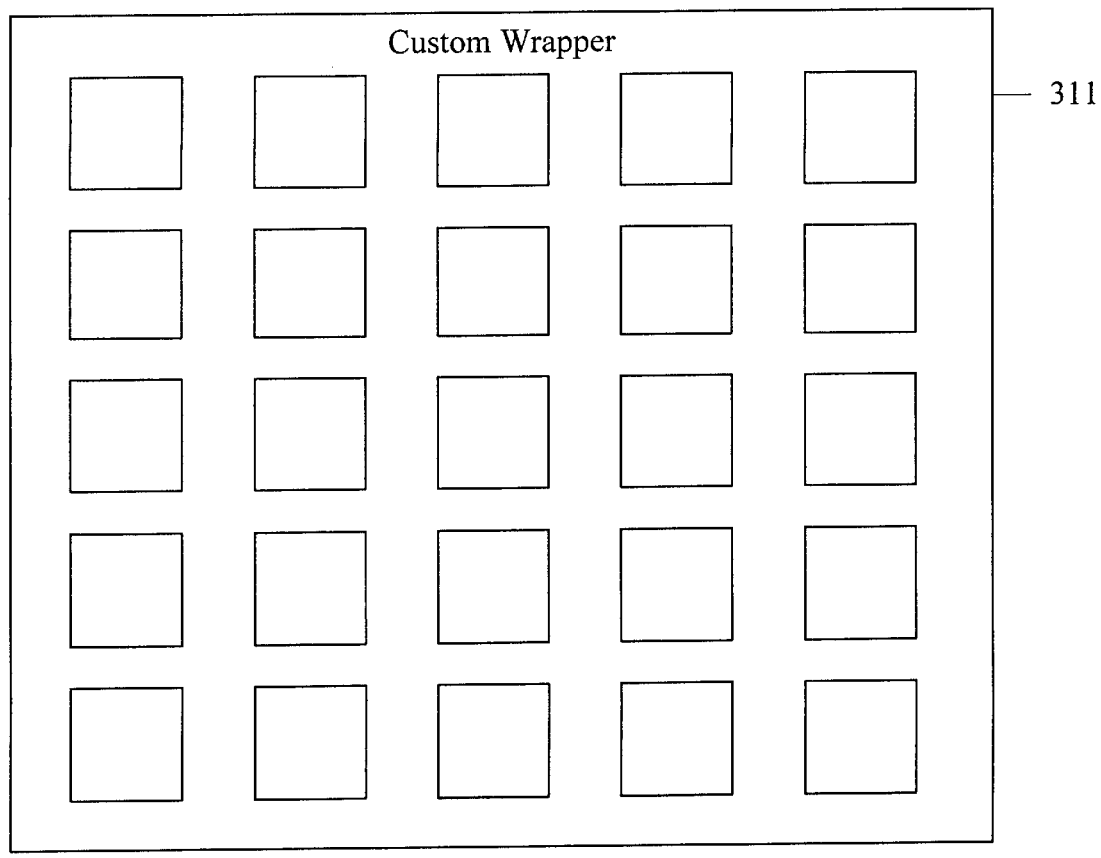
FIG. 3B is a block diagram depicting a variation file for a two-dimensional array of video filter elements.

A single plug-in may be beneficially applied to provide parameters for two or more megafunctions. This may allow the design system (usually via the plug-in) to automatically make connections between distinct megafunctions that a user would normally have to manually enter. It may also help to focus the user's selection possibilities to only those that are appropriate for the selected combination of megafunctions. Still further, it may allow the user to select one of two or more related megafunctions that perform roughly equivalent functions but in different manners. FIGS. 3A and 3B illustrate two variation files (with associated megafunctions) produced by plug-ins pertaining to two or more megafunctions. FIG. 3A illustrates a variation file 301 containing megafunctions for implementing a fast Fourier transform. Within variation file 301 are a fast Fourier transform core 303, a RAM memory block 305 and a buffer 307. The core 303 may read in stored values from memory 305 as inputs and then successively multiply those values with constants and accumulate the results in various combinations. The multiplication and subsequent accumulation operations may require the user of buffer 307.

The plug-in that provides variation file 301 may present the user with various options for the size and configuration of memory block 305 and buffer 307. It may also ask the user for certain details of FFT core 303 such as the accuracy, precision, and associated speed. From this information, the plug-in manager may make connections to provide a single design suitable for the configurations and connections specified by the user. Note that unlike a traditional design process, this design process does not require that the user/developer make the connections between the megafunctions manually.

Note that in some cases, the plug-in may be sufficiently sophisticated to determine the size and configuration of memory 305 and 307 from user/developer input pertaining to FFT core 303. Certain user inputs pertaining to the memory itself may help facilitate the plug-ins' decisions. For example, the plug-in wizard may present the user with options for a single port memory, a dual port memory, multiple interleaved memories, etc. From the selection information, the plug-in selects memory of appropriate size and type and then makes appropriate connections to core 303.

Another example of a single plug-in handling multiple megafunctions is illustrated in FIG. 3B. Here, a custom variation file 311 defines a two-dimensional video filter comprised of a 5×5 array of individual video filter elements. Depending upon the application, the individual filter elements of variation file 311 may have to be separately fine tuned, depending upon their relative positions in the larger filter. For example, the location of some filter elements may allow them to be made smaller while location of others suggests that they be made larger. Further, different filter elements may be required to scale their results by different factors. In other words, some filter elements may require a multiply by two operation, while others require a multiply by three operation, while still others require a multiply by four operation, etc.

Using a plug-in design to generate a two-dimensional video filter array from a generic filter element megafunction, the user will not have to duplicate the parameter specification for each and every filter element that he or she wishes to use in the filter array. The plug-in may allow the user to identify the number of elements in the array and fine tune their properties with general inputs, rather than specific inputs for each filter element. The plug-in may ultimately generate the appropriate connections between the filter elements (without specific user input) and may simplify the functioning of the individual elements depending upon the specified parameters. For example, the plug-in may recognize that when scaling by a factor of two or four is required, the associated filter elements can be implemented with shift operators, rather than more complex multipliers.

As indicated, the term "megafunction" is used herein to represent any number of functional blocks (typically representing digital circuitry). Generally, the terms "megafunction" and "core" are used to represent relatively large complex logic blocks such as processors, fast Fourier transform encoders, etc. This invention, however, is not limited to functional design blocks of any particular size. It may cover macrofunctions and other relatively small functional blocks. Generally, any such functional block should provide a parameterized design in a format that allowing users to specify "options" (operating parameters, connections, etc.).

Generally, a megafunction will include HDL code or an equivalent representation of the functional block. The HDL code may be source code that is either encrypted or unencrypted, depending upon the security concerns of the supplier. Alternatively, the megafunction may be provided as a schematic representation of the functional block provided in a format that can be compiled by an EDA environment. Typically, the representation of the functional block will be sufficiently detailed that it includes counters, registers, and other comparable design features. However, it will not be provided at the level of a synthesized or minimized net list. Conventionally, the compiler synthesizes the higher level representation (e.g., a megafunction) to produce a minimized net list.

Generally, because the parameter settings are left unspecified, a megafunction of this invention will not be provided with layout level design features such as transistor placement, physical line widths, etc. This information is typically provided with non-parameterized cores or other design blocks for Application Specific Integrated Circuits (ASICs) and the like. However, this does not mean that the invention cannot be practiced in the context of a functional design block that specifies at least some level of hardware layout.

The wizard interface provided by the plug-in may allow for a wide variety of user options. In one example, these options are merely the parameters specified in the HDL or schematic description of the functional block. Such parameters are usually very easy to identify because they are identified by a "parameter statement" or equivalent code in HDL. Further, the megafunction designer, who also designs the plug-in, typically designs the megafunction with particular flexible parameters in mind. Examples of suitable parameters for use with this invention include bus widths, buffer sizes and dimensions, input data rates, certain types of CRC encoding, memory sizes and dimensions, output signal format, internal structure, PLD features, and the like. Wizard options may also request optimizations such as those for speed, size, routability, and the like. For example, an adder that should be generated in a megafunction with the design option "small" might be a ripple-carry structure (one of the simplest adder designs). Wizard options may also specify whether pipelining should be used to increase efficiency. Still further, wizard options might specify whether memory should be implemented as registers or embedded memory.

Another category of options that may be specified by a wizard of this invention, include port connection options. These allow the user/developer to specify whether a particular port in the megafunction should be connected or left unconnected. For example, in the case of a Universal Asynchronous Receiver Transmitter (UART), a wizard may give the user the option of specifying use of only the receiver or transmitter portion. If the user indicates that the transmitter portion is not to be used, the plug-in may simply leave all ports pertaining to the transmitter function unconnected. Similarly, a user/developer may specify that an interrupt is or is not to be used, in which case the plug in will leave an interrupt port connected or disconnected. Similar options can be provided for modem interfaces, various indicators (e.g., when a buffer is full), and the like.

Still other options that may be presented by the wizard include two alternative megafunctions performing roughly the same function. Either megafunction may be used in the overall electronic design, but implement slightly different functions. For example, in FIG. 1, the user is given the option of choosing (a) a FIFO buffer that synchronizes both reading and writing to a single clock or (b) a FIFO buffer that synchronizes reading to a read clock and writing to a separate write clock.

Still further, the wizard may present the user/developer with the option of having their choices displayed in various formats. In the example of FIG. 1, the user could be given the option of specifying the format of symbol 11, which schematically depicts the user's selections. Similarly, a wizard for a sophisticated filter may give the user/developer the option of multiple formats for displaying the transfer function of the filter that he or she is building. Still further, the user/developer may be given the option of playing back a tone that he or she has selected for a telephony application.

Figure 4:
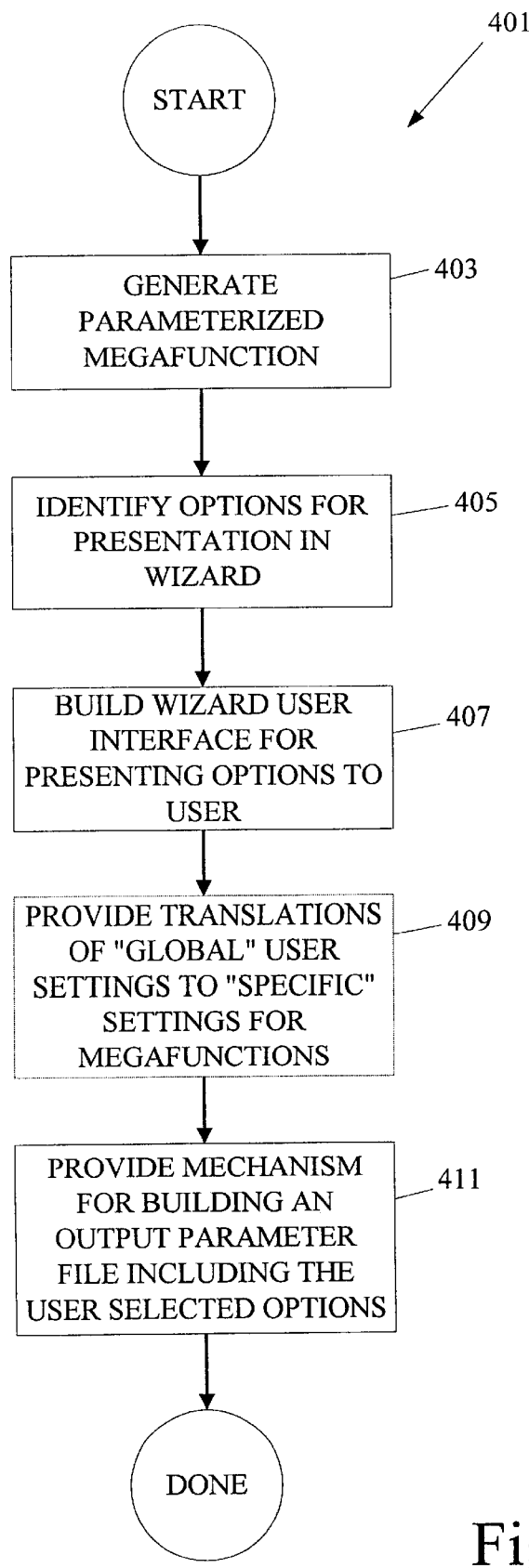
FIG. 4 is a process flow diagram illustrating a method for creating a megafunction plug-in in accordance with an embodiment of this invention.

FIG. 4 presents one possible process flow for creating plug-ins in accordance with this invention. These steps may be automated or performed manually by an individual developing a plug-in. As shown, a process 401 begins at 403 with the generation of a parameterized megafunction. Such megafunctions may be generated in accordance with conventional megafunction design practice.

After the megafunction has been generated, the options for presentation to the user are identified at 405. These options may include parameters specified in the megafunction as well as other options as described above. After these options are identified, the wizard user interface may be constructed in a manner that presents these options to the user when the associated plug-in is launched. See 407. In a preferred embodiment, standard tools for building graphical user interfaces can be used. Examples of such tools include Visual C++ and Visual J++ (an object oriented tool for generating Java applications). If the plug-in is of the type that allows the user to make "general" settings, the plug-in must include translations so that when the general selection from the user is received, it can be translated into specific settings for the one or more megafunctions associated with the plug-in. See 409. Typically a general selection implies a set of specific settings for the associated megafunctions.

One example of a general setting is the choice of a particular Cyclic Redundancy Check (CRC) algorithm associated with a CRC generator megafunction. There are various algorithms for implementing a CRC generator. Each algorithm is associated with a collection of parameter settings. The wizard associated with a CRC generator megafunction need not ask the user for specific CRC constants required to implement a particular CRC algorithm. Instead, the wizard may specify a list of available CRC algorithms. Each algorithm has specific coefficients, feedback values, etc., associated therewith. The plug-in stores these values and, depending upon which algorithm the user chooses, the plug-in will provide the associated list of parameters for the instantiation. Note that when a user selects a particular CRC algorithm, the wizard may actually present the various parameter values associated with that selected algorithm so that the user can fine tune the settings associated with his or her selected algorithm.

In addition to providing the graphical user interface and any necessary translations for general user settings, the plug-in should be provided with a mechanism for building an output parameter file (e.g., file 211 of FIG. 2). See 411. The plug-in should be designed so that the output parameter file includes the user-selected options presented in a format that can be read and understood by the plug-in manager. After steps 403, 405, 407, 411, and optionally 409 have been completed, the plug-in will be ready for use.

As indicated above, a standard parameterized megafunction may be employed with the plug-ins of this invention. Such megafunctions are typically written in a Hardware Description Language such as Verilog, VHDL, or AHDL (the Hardware Description Language that may be used with products of Altera Corporation). Generally, user adjustable parameters are easy to spot in code written in any of these languages. FIG. 5 presents a simple example showing a part of a megafunction written in AHDL. It is assumed that the reader is familiar with AHDL coding syntax and techniques.

The book "Max+plus® II AHDL" November 1995 available from Altera Corporation of San Jose, Calif. is incorporated herein by reference for all purposes.

As shown in FIG. 5, the megafunction of interest describes a FIFO buffer. It has the title "FIFO." The AHDL code associated with this megafunction may begin with various comments followed by a "parameter statement." After a parameter statement in AHDL, a list of parameters and associated default values are provided. The parameter statement and associated parameter list is referred to as a PARAMETER block 511.

Note that if no default value is specified for a particular parameter identified in the parameter section of the AHDL code, the user is obligated to provide a value for that parameter before the megafunction can be implemented. In this simple example, there are two parameters: BUFFER_DEPTH and INPUT_BUS_WIDTH. Further, the parameter BUFFER_DEPTH is set equal to a default value of 32. The parameter INPUT_BUS_WIDTH, in contrast, does not have a default value. Therefore, the user is obligated to specify a value for the INPUT_BUS_WIDTH before the megafunction FIFO can be implemented.

In AHDL, all parameters are provided between open and closed parenthesis and follow a parameter's statement, as illustrated. The AHDL code describing any megafunction, such as megafunction FIFO, includes various other sections describing the structure and functions of the megafunction. Typically, as shown in FIG. 5, the "PARAMETERS" section is followed by a "SUBDESIGN" section that defines the ports. This allows the user to specify the various ports to and from the associated megafunction. Other sections of AHDL code describing a megafunction include, for example, a "VARIABLE" section used to instantiate subdesigns by providing values for variables, and a "BEGIN" section used to connect subdesigns.

As mentioned, compilers for some Hardware Description Languages cannot easily compile parameterized functional blocks. However, they can be written in parameterized form. When a plug-in of this invention is provided to capture user selections of parameterized values for such functional blocks, the difficulty in compiling can be minimized. This is because the plug-in manager generates a variation file containing the necessary parameter values in a format that, from the compiler's perspective, gives the appearance of a non-parameterized functional block (when used in conjunction with the HDL file for the underlying parameterized functional block). Note that Hardware Description Languages such as VHDL and Verilog do a better job of synthesizing non-parameterized designs, including designs having megafunctions incorporated therein.

A plug-in provided for megafunction FIFO will present, when launched, a wizard that allows the user to specify values for the parameters BUFFER_DEPTH and INPUT_BUS_WIDTH. The wizard may likely present a default value of 32 for the buffer depth, but give the user the option of setting that to a different value. The user must select a value of the input bus width in order to implement the megafunction. After the user has presented his or her selections to the wizard graphical user interface, the plug-in creates a parameter file and forwards that file to the plug-in manager (e.g., manager 209 of FIG. 2). The plug-in manager then generates a "variation file" (see file 213 of FIG. 2) that the compiler can use together with the megafunction FIFO to implement a FIFO buffer including the user specification. As shown in FIG. 5, a variation file 513 produced by the plug-in manager from the user's selections is identified as "my-fifo-instance." In variation file 513, the user-specified parameters follow a "FIFO WITH" statement. The user has specified an input bus width of 16 bits. Because the user has not specified a buffer depth, no reference to buffer depth appears in the variation file. Therefore, the default value of 32 words is used by the EDA compiler when compiling the megafunction with variation file 513.

Figure 6A:
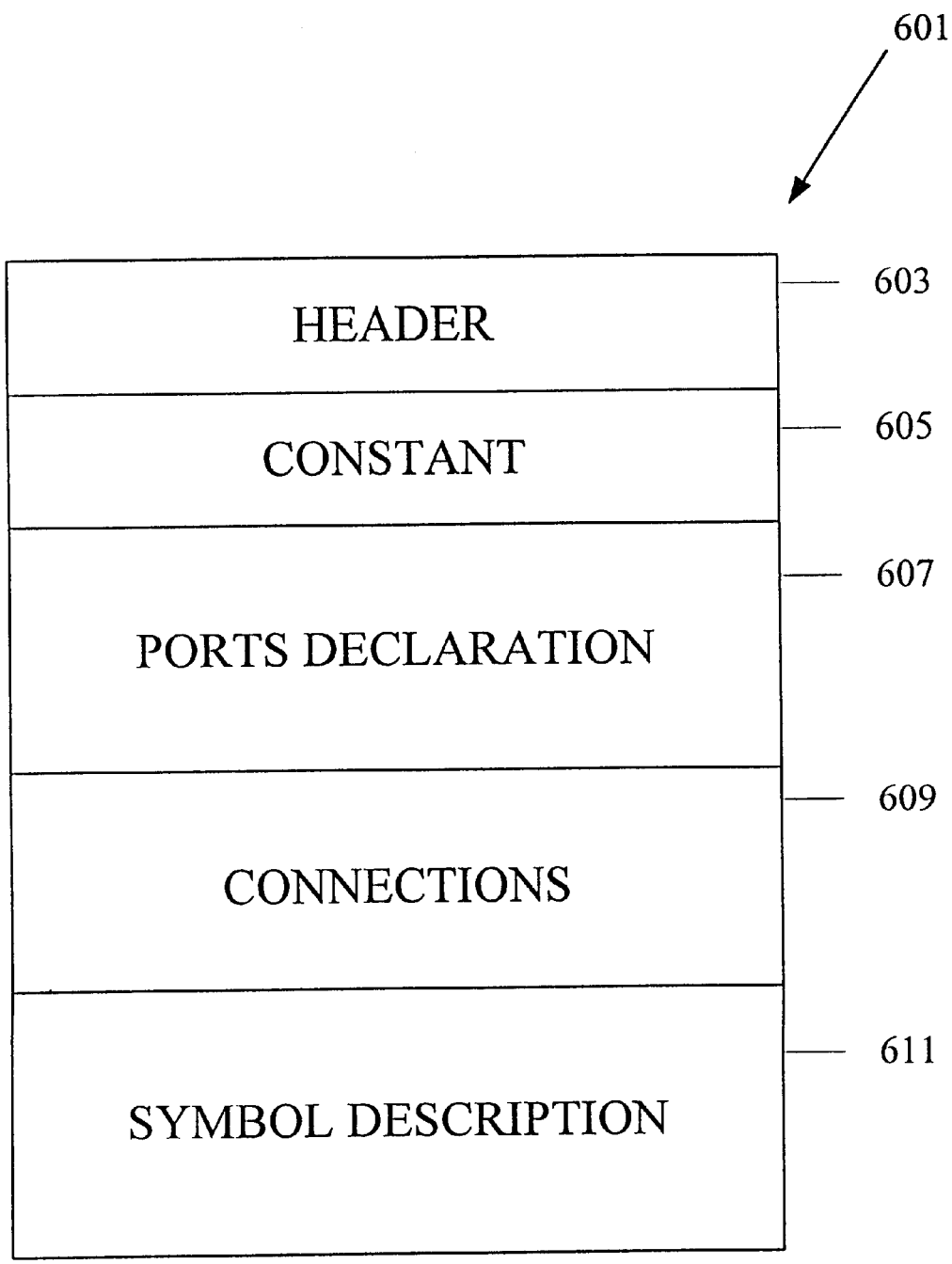
FIG. 6A is a block diagram illustrating the components and arrangement of an output parameter file created by a plug-in in accordance with an embodiment of this invention.

As indicated in the process flow of FIG. 4, at 411, a plug-in of this invention preferably generates an output parameter file in a format that can be understood by a plug-in manager. That format may specify particular types of information to be included in the file as well as the arrangement of that information. FIG. 6A presents one example of a format for an output parameter file in accordance with this invention.

As shown in FIG. 6A, an output parameter file 601 includes at least five sections. First it includes a header section 603 which identifies the megafunction(s) that will be used in the variation file. Next, file 601 includes a "CONSTANT" section 605 that specifies parameter values specified by the user via the wizard. Next, a section 607 provides PORT declarations for the megafunction. This section includes the labels of the various ports associated with the megafunction, their sizes, whether they are implemented or not, etc. Next, a section 609 specifies the CONNECTIONS made to the megafunction (often through the ports declared in section 607). The information in section 609 specifies how the megafunction module under consideration is connected to surrounding modules. Finally, a SYMBOL section 611 optionally presents a symbolic or schematic representation of the megafunction (with user specified options) in a format that can be edited with an EDA editing tool.

A sample output parameters file is provided in FIG. 6B. As shown, it includes a header section 603 identifying the base megafunction, single-clock FIFO "SCFIFO." Note that if the plug-in had made use of multiple megafunctions, each of them would have been listed in section 603. The output parameters file next includes a section denoted "PRIVATE." To simplify the drawing most entries in the PRIVATE section have not been shown. Basically, this section presents internal variables of the plug-in, which may include some or all of the possible parameters that could be adjusted within the megafunction. The list may also include wizard options that do not appear as parameters in the base megafunction (e.g., the option of selecting one base megafunction from a group of available base megafunctions). The plug-in maintains this list internally. Typically, not all of these items listed in the PRIVATE section are presented to the user, only those options that the plug-in presents via the wizard interface. These PRIVATE parameters have no influence on the variation.

The CONSTANT section 605 includes the values specified by the user via the plug-in. In this example, the user specified a FIFO width of 8 bits and a FIFO depth of 256 words. Next, the PORTS DECLARATION section 607 lists the input and output ports—as identified by the "USED_PORT" designation. Next, the CONNECTIONS section 609 lists the connections made to the megafunction. As illustrated, in this case, the megafunction and variation have the same port names. Finally, the SYMBOL DESCRIPTION section 611 includes a series of symbol entries describing the display of the variation.

Figure 7:
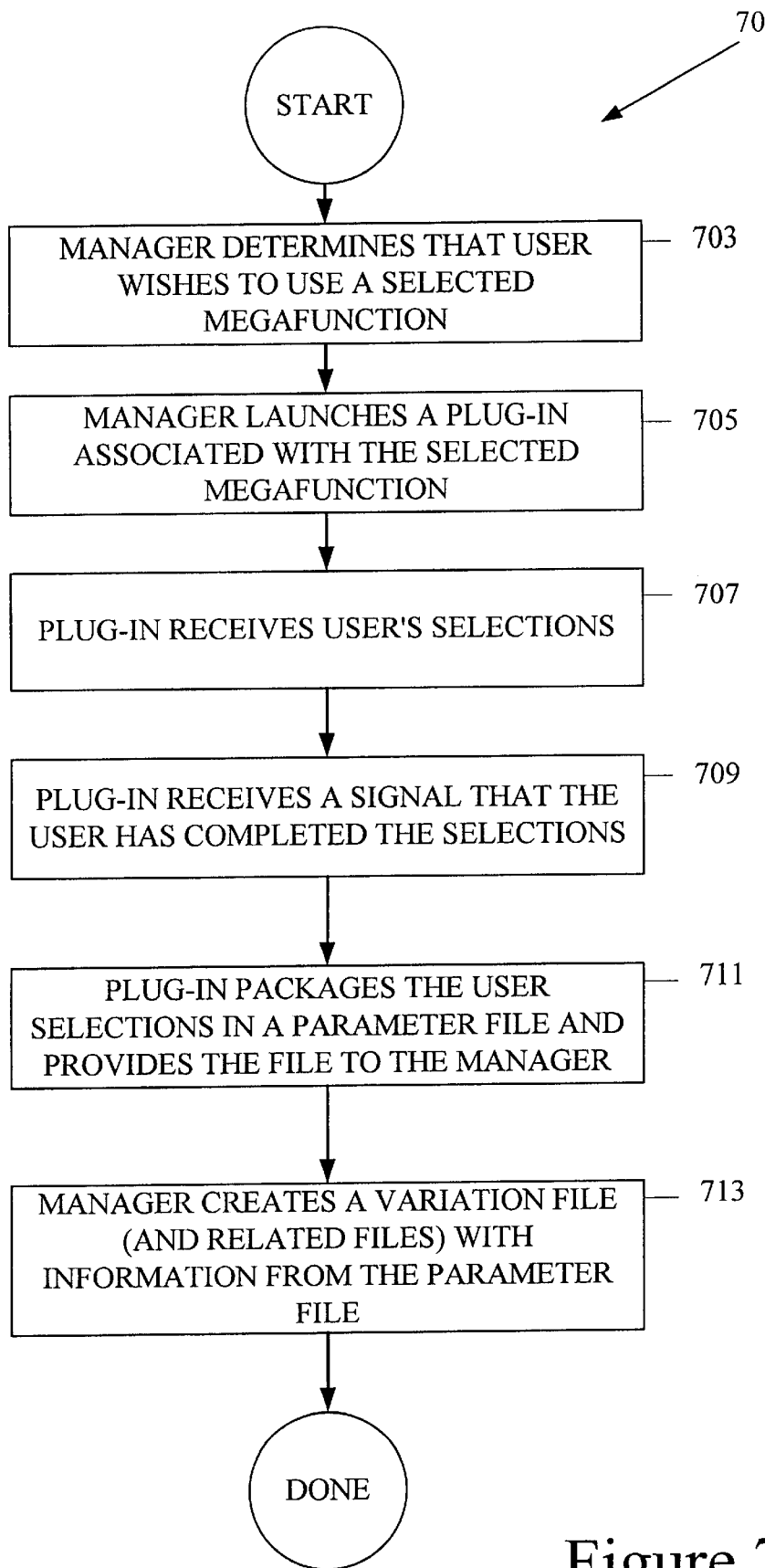
FIG. 7 is a process flow diagram illustrating a method of receiving user-selections, converting them to a parameters file, and preparing/using a variation file for the user-selections.

FIG. 7 presents a process flow under which a plug-in and plug-in manager of this invention may operate. As shown, a process 701 begins with the plug-in manager determining that a user wishes to use a selected megafunction in his or her design. See 703. Then, at 705, the manager launches a plug-in associated with the selected megafunction. The launched plug-in acts as a wizard and presents the user with options for various features of the selected megafunction. See 707. In one preferred embodiment, the wizard presents the options to the user in a "multi-page" format,. Note that the window presented in FIG. 1 represents but one of several pages presented by the wizard associated with a FIFO buffer megafunction.

Eventually, the user will complete his or her selections of parameters and other options associated with the megafunction. The user will then select a finish button or otherwise indicate that he or she has completed the process. At that point, the plug-in receives a signal that the user has completed selections. See 709. From there, the plug-in packages the user's selections in a parameter file and provides that file to the plug-in manager. See 711. Finally, at 713, the manager creates a variation file (and other related files) with the information it received from the plug-in. The resulting variation file may be used by a standard EDA environment (with compiler) to implement a megafunction in a larger design as specified by user inputs to the EDA environment.

As indicated at 713, the manager creates a variation file and other related files. The variation file will be described in more detail below. Among the other files that may be generated by the manager, in response to receipt of the parameter's file, are a declaration file and an optional symbol file. The declaration file specifies information required by the compiler to describe the interface of the "variation." The symbol file provides a symbolic representation of the megafunction variation for use by an EDA symbol editor.

Figure 8A:
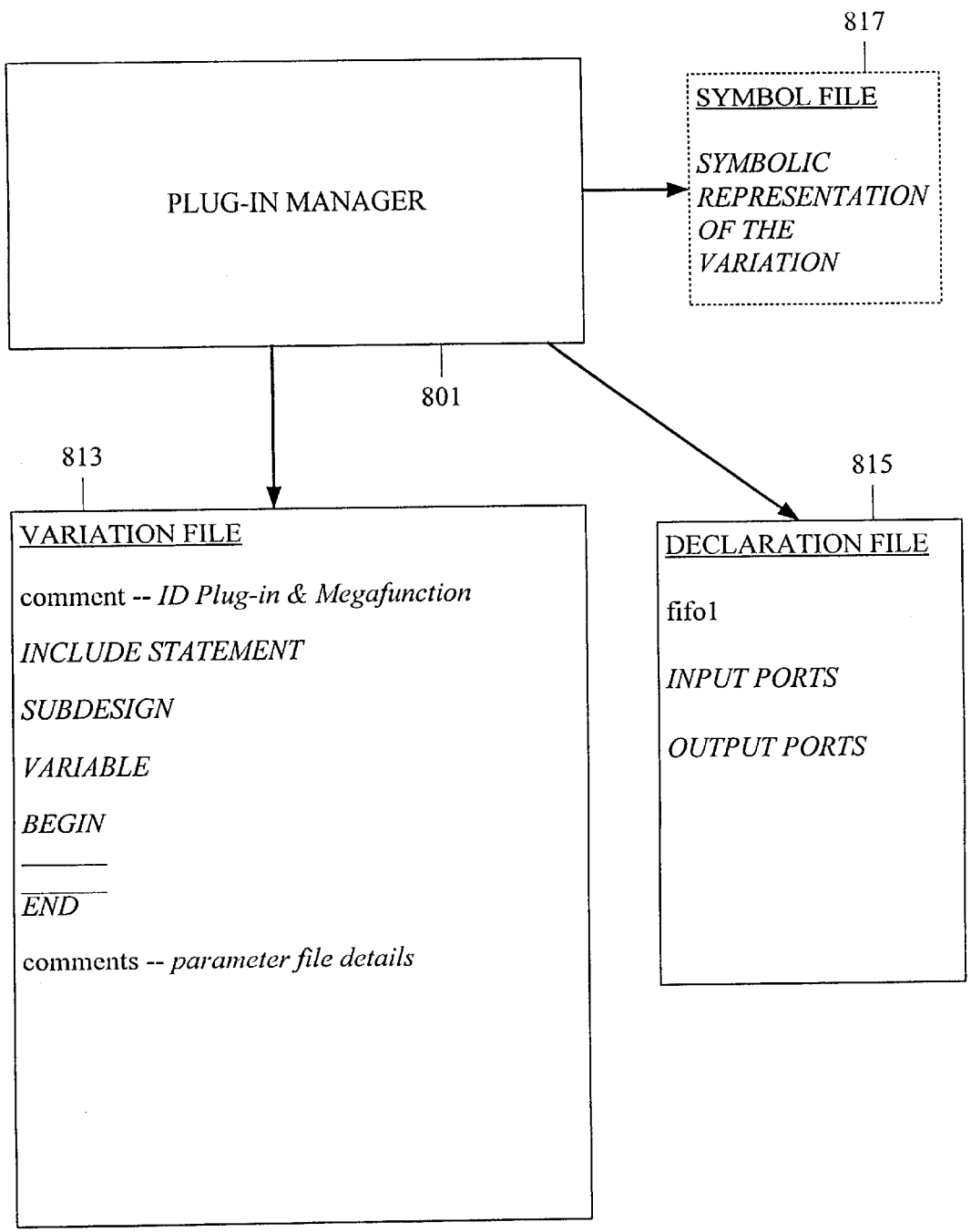
FIG. 8A is a block diagram illustrating the files created by a plug-in manager (and their contents) in accordance with an embodiment of this invention.

FIG. 8A illustrates that a plug-in manager 801 may generate two or more HDL files: a variation file 813, a declaration file 815, and an optional symbol file 817. As shown in FIG. 8A, variation file 813 may include various sections. It is prefaced with a comment line indicating the particular plug-in/wizard from which the variation file data was derived. It ends with a number of additional comments which essentially present the information contained in the parameter file itself. Between the introductory and conclusion comments are series of HDL statements. Essentially, variation file 813 is an HDL description of a functional block. It serves to instantiate the variation of the megafunction in a form that can be understood by the compiler. The instantiation of the megafunction in HDL statements presents the user-specified set of options, but does not go into the detailed interpretation of the megafunction as specified in the basic megafunction file.

First, a variation file, such as variation file 813, includes an "INCLUDE" statement specifying to the compiler that the entity described in the declaration file must be considered in the overall design. Next, variation file 813 includes a "SUBDESIGN" section listing each of the ports that are used in the variation of the base megafunction. As mentioned, a given base megafunction may specify many ports beyond those selected by the user for use with the variation. Next, the variation file includes a "VARIABLES" section that serves to instantiate the megafunction. It is the point in the variation file where the underlying base megafunction is identified. In this example, the underlying base megafunction is "FIFO." In AHDL, this section includes a "WITH" statement mapping variable names used in the variation file to corresponding variable names used in the megafunction. Finally, the variation file includes a "BEGIN" section that specifies a mapping between connections identified in the variation's file and connections provided with the underlying base megafunction. This allows the compiler to map information from the "SUBDESIGN" section of the variation file to corresponding ports in the base megafunction description. Thus, for example, the size and type of port specified by the user/developer in the variation file is mapped to the proper location on the megafunction.

Declaration file 815 includes two basic components: an identification of the variation ("fifo1" in this case) and a list of the ports used in the variation. The ports are segregated into input and output groups as shown. The combined list of ports in this section of the declaration file includes the same information as provided in the "SUBDESIGN" section of the corresponding variation file. The purpose of the declaration file is to identify to the compiler how the megafunction variation block fits into the larger design being developed by the user/developer. This file is generated to conform with the expectations of a conventional EDA compiler. Theoretically, it is not necessary.

Figure 8B:
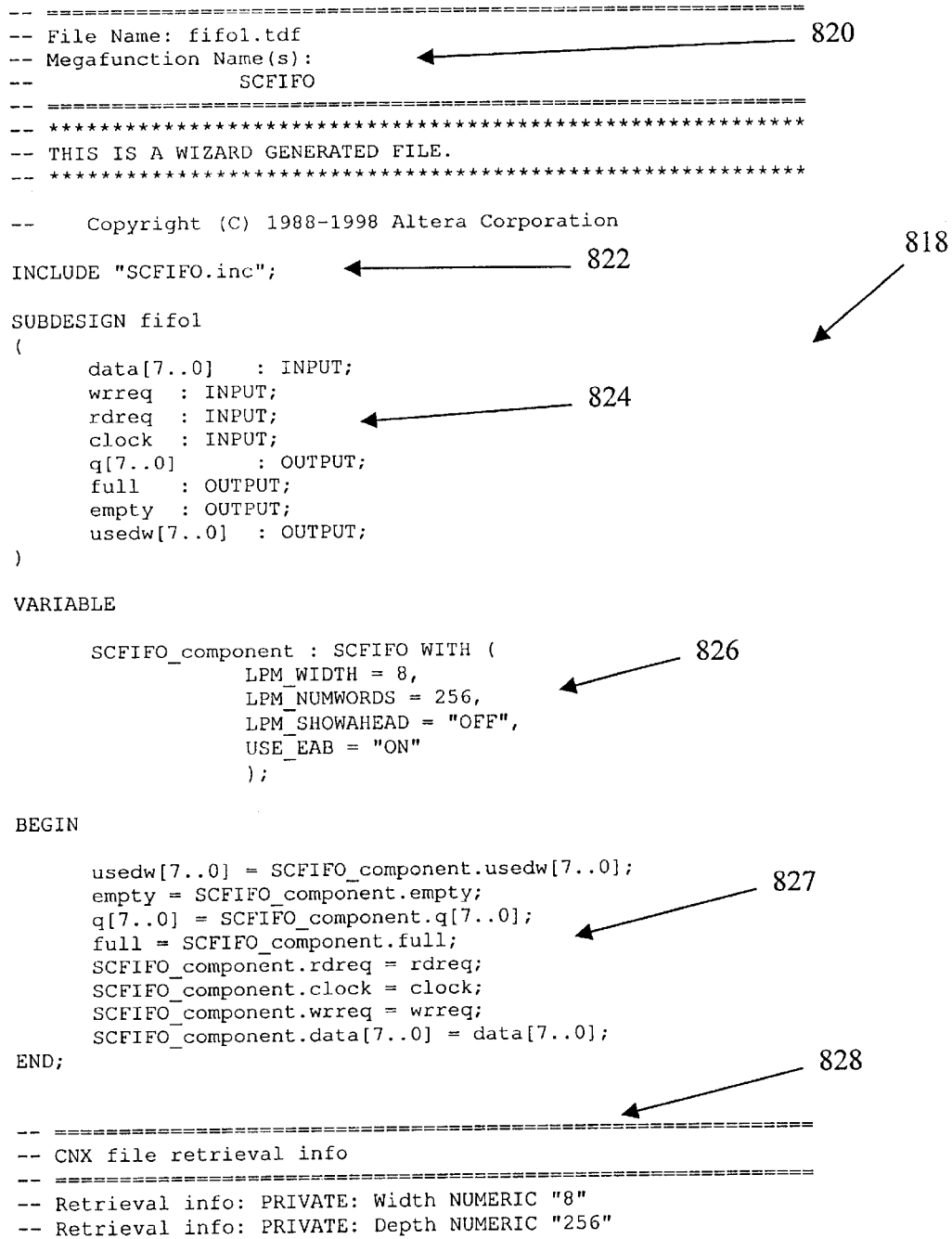
FIG. 8B presents a sample file containing AHDL code for a variation on a FIFO megafunction.

FIG. 8B depicts a sample variation file written in AHDL for a user-defined variation 818 of a parameterized FIFO megafunction. A comment section 820 near the top of the file indicates that the variation is named "fifo1.tdf" and the base megafunction is named "SCFIFO." The first statement in file 818 is an INCLUDE statement 822 indicating that the base megafunction, SCFIFO, should be included with the variation. Next, a SUBDESIGN section 824 identifies the ports in the variation fifo1.tdf. As illustrated, this section includes, for each port selected by the user/developer, a port name, a port size, and an I/O status. A VARIABLE section 826 assigns values to parameters specified in megafunction SCFIFO. These are the values that the user/developer has assigned to the particular parameters in the variation. Thus, the "VARIABLES" section that serves to instantiate the megafunction. As shown, it includes a "WITHF" statement for assigning values to variable names used in the megafunction. The compiler will use these values when compiling the megafunction SCFIFO. In the example shown, the buffer is assigned width of 8 bits and a depth of 256 words. A BEGIN section 827 maps fifo1.tdf ports identified in SUBDESIGN section 824 with corresponding ports in megafunction SCFIFO. This allows the compiler to map information from the "SUBDESIGN" section of the variation file to corresponding ports in the base megafunction description. Thus, for example, the size and type of port specified by the user/developer in the variation file is mapped to the proper counterpart on the megafunction. Finally, the variation file 818 ends with a list of comments 828 presenting the contents of a parameter file used by the manager to create the variation.

Similar variation files may be used for VHDL and Verilog megafunctions. FIGS. 8C and 8D depict a VH-IDL version of the fifo1 variation on the parameterized SCFIFO megafunction. Similarly, FIG. 8E depicts a Verilog version of the fifo1 variation.

FIGS. 8F and 8G present example declaration files for fifo1 written in AHDL and VHDL, respectively. Note that these files include the port information containing in the SUBDESIGN section of the variation file.

During compilation, the compiler will first identify the include file (declaration file) in the context of the larger design. After it has obtained the necessary information about the interface of the variation from the include file, the compiler is pointed to the variation file where it obtains more details of the user's variation. And, from the variation file, the compiler is pointed to the underlying base megafunction file to obtain further interpretation details of the functional block. The compiler proceeds through the include file, the variation file, and the base megafunction file recursively to obtain the primitives that it needs to compile the user's design.

Embodiments of the present invention relate to an apparatus for performing the above-described operations. This apparatus may be specially constructed for the required purposes, or it may be a general-purpose computer selectively activated or reconfigured by a computer program stored in the computer. The processes presented herein are not inherently related to any particular computer or other apparatus. In particular, various general-purpose machines may be used with programs written in accordance with the teachings herein, or it may be more convenient to construct a more specialized apparatus to perform the required method steps. The required structure for a variety of these machines will appear from the description given above.

In addition, embodiments of the present invention further relate to computer readable media that include program instructions for performing various computer-implemented operations. The media may also include, alone or in combination with the program instructions, data files, data structures, and the like. The media and program instructions may be those specially designed and constructed for the purposes of the present invention, or they may be of the kind well known and available to those having skill in the computer software arts. Examples of computer-readable media include, but are not limited to, magnetic media such as hard disks, floppy disks, and magnetic tape; optical media such as CD-ROM disks; magneto-optical media such as floptical disks; and hardware devices that are specially configured to store and perform program instructions, such as read-only memory devices (ROM) and random access memory (RAM). The media may also be a transmission medium such as optical or metallic lines, wave guides, etc. including a carrier wave transmitting signals specifying the program instructions, data structures, etc. Examples of program instructions include both machine code, such as produced by a compiler, and files containing higher level code that may be executed by the computer using an interpreter.

Figure 9:
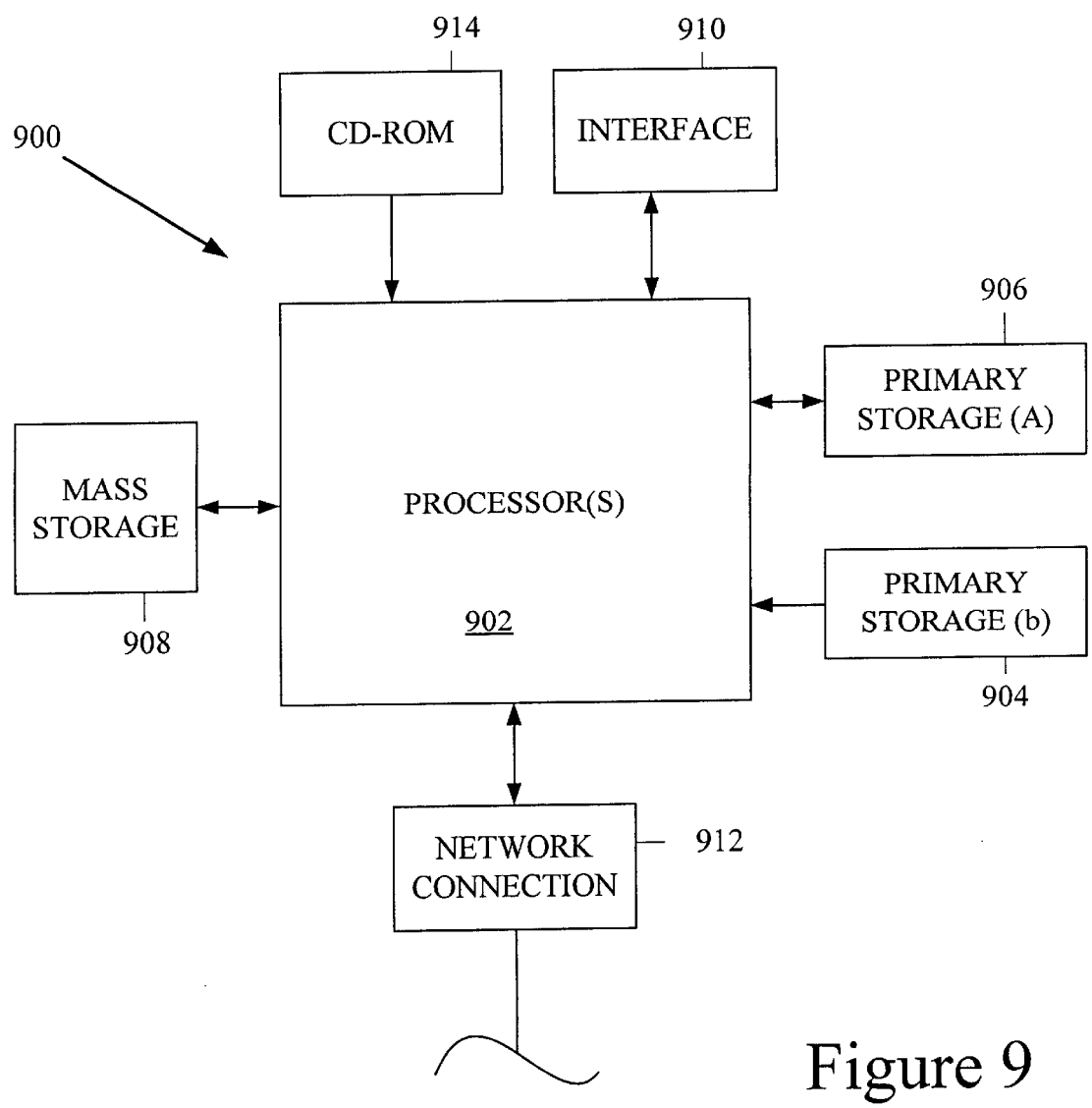
FIG. 9 is a block diagram of a general-purpose computer system that may be employed to implement plug-ins, plug-in managers, and other system entities employed in the present invention.

FIG. 9 illustrates a typical computer system in accordance with an embodiment of the present invention. The computer system 900 includes any number of processors 902 (also referred to as central processing units, or CPUs) that are coupled to storage devices including primary storage 906 (typically a random access memory, or "RAM"), primary storage 904 (typically a read only memory, or "ROM"). As is well known in the art, primary storage 904 acts to transfer data and instructions uni-directionally to the CPU and primary storage 906 is used typically to transfer data and instructions in a bi-directional manner. Both of these primary storage devices may include any suitable type of the computer-readable media described above. A mass storage device 908 is also coupled bi-directionally to CPU 902 and provides additional data storage capacity and may include any of the computer-readable media described above. The mass storage device 908 may be used to store programs, data and the like and is typically a secondary storage medium such as a hard disk that is slower than primary storage. It will be appreciated that the information retained within the mass storage device 908, may, in appropriate cases, be incorporated in standard fashion as part of primary storage 906 as virtual memory. A specific mass storage device such as a CD-ROM 914 may also pass data uni-directionally to the CPU.

CPU 902 is also coupled to an interface 910 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 902 optionally may be coupled to a computer or telecommunications network using a network connection as shown generally at 912. With such a network connection, it is contemplated that the CPU might receive information from the network, or might output information to the network in the course of performing the above-described method steps. The above-described devices and materials will be familiar to those of skill in the computer hardware and software arts.

The hardware elements described above may be configured (usually temporarily) to act as multiple software modules for performing the operations of this invention. For example, instructions for running a plug-in, plug-in manager, and/or compiler may be stored on mass storage device 908 or 914 and executed on CPU 908 in conjunction with primary memory 906.

Figure 10:
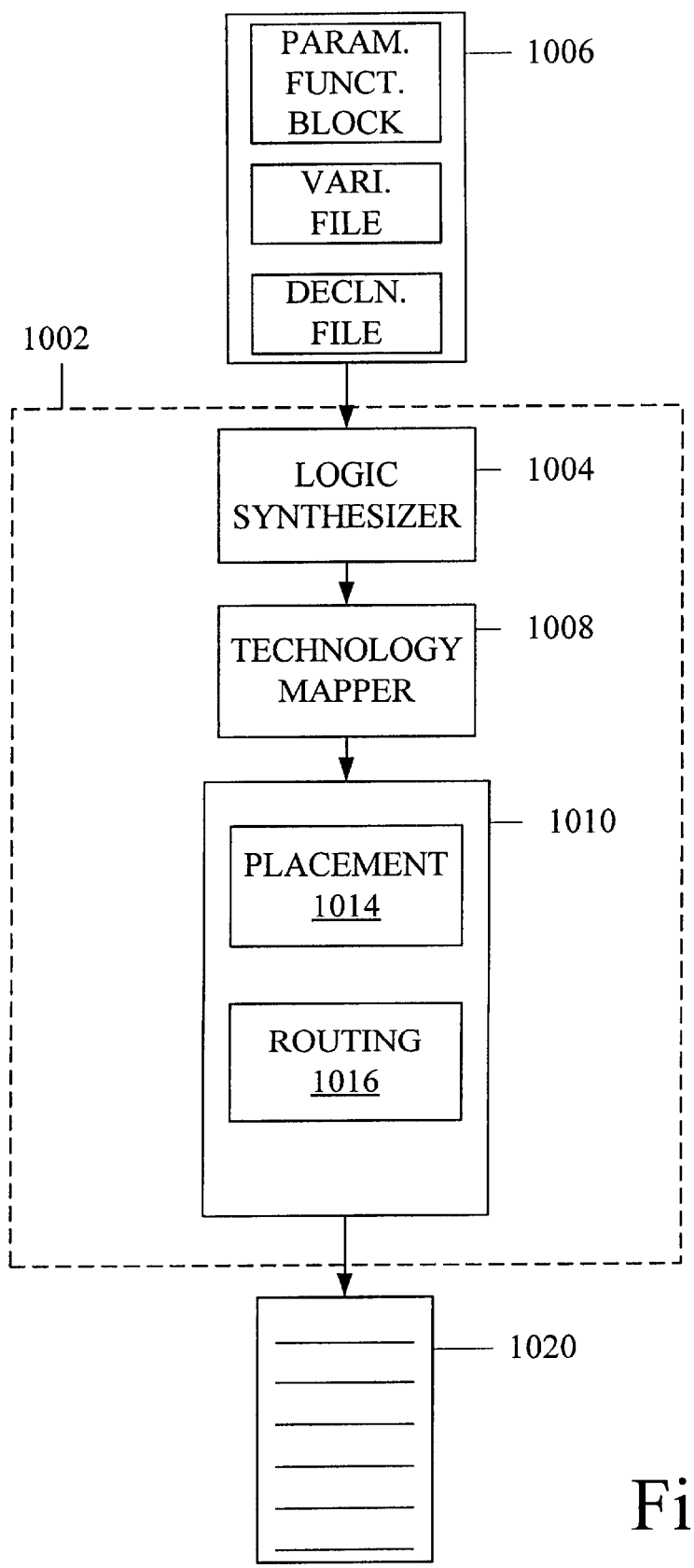
FIG. 10 is a schematic/process diagram illustrating the components and general flow of a compiler that may be used in conjunction with the present invention.

In a preferred embodiment, the compiler is divided into software submodules. Referring to FIG. 10, an exemplary compiler 1002 includes a logic synthesizer 1004 which creates a synthesized netlist from a user's high level electronic design 1006 (including variation files, parameterized functional block files, declaration files, symbol files, etc.). Compiler 1002 also includes a technology mapper 1008 that maps gates from the synthesized netlist into logic cells. Finally, compiler 1002 includes a place and route module 1010 that in turn includes a placement module 1014 and a routing module 1016. Placement module 1014 places logic cells onto specific logic elements of a target hardware device. Routing module 1016 connects wires between the inputs and outputs of the various logic elements in accordance with the logic required to implement the electronic design. Compiler 1002 outputs a compiled design 1020. It should be understood that other compiler designs may be employed with this invention. For example, some compilers will include a partitioning module to partition a technology-mapped design onto multiple hardware entities. In addition, the compiler may be adapted to handle hierarchical designs, whereby synthesis, mapping, etc. are performed recursively as the compiler moves down branches of a hierarchy tree.

Figure 11:
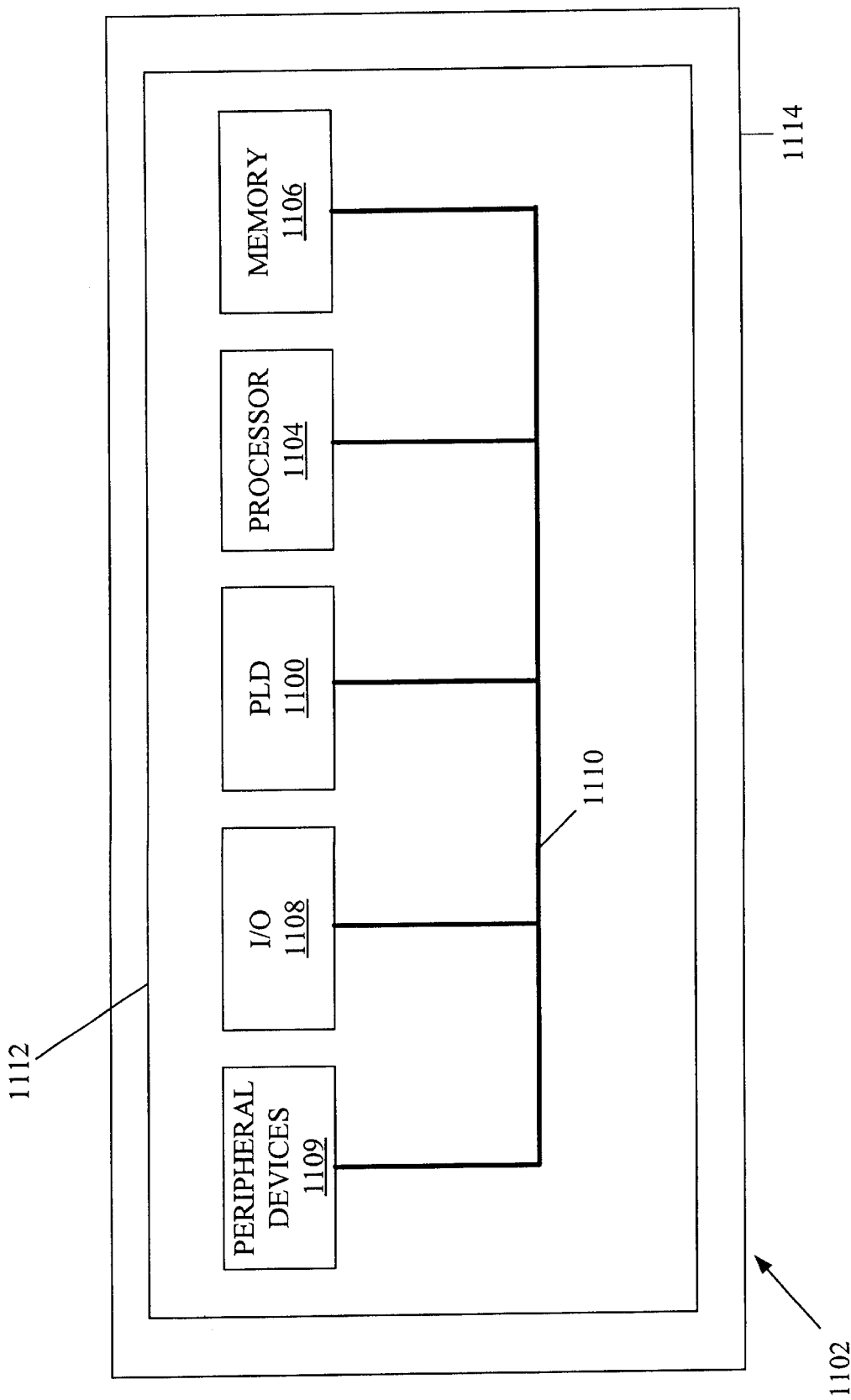
FIG. 11 is a block diagram of a programmable logic device and associated system, in which the PLD may be generated in accordance with the methods of this invention.

This invention also relates to programmable logic devices programmed with a design prepared in accordance with the above-described methods. The invention further relates to systems employing such programmable logic devices. FIG. 11 illustrates a PLD 1100 of the present invention in a data processing system 1102. The data processing system 1102 may include one or more of the following components: a processor 1104, memory 1106, I/O circuitry 1108, and peripheral devices 1109. These components are coupled together by a system bus 1110 and are populated on a circuit board 1112 that is contained in an end-user system 1114.

The system 1102 can be used in a wide variety of applications, such as computer networking, data networking, instrumentation, video processing, digital signal processing, or any other application where the advantage of using programmable logic (including reprogrammable logic) is desirable. The PLD 1100 can be used to perform a variety of different logic functions. For example, PLD 1100 can be configured as a processor or controller that works in cooperation with processor 1104. The PLD 1100 may also be used as an arbiter for arbitrating access to a shared resource in the system 1102. In yet another example, the PLD 1100 can be configured as an interface between the processor 1104 and one of the other components in the system 1102. It should be noted that the system 1102 is only exemplary.

The foregoing describes the instant invention and its presently preferred embodiments. Numerous modifications and variations in the practice of this invention are expected to occur to those skilled in the art. For instance, the techniques and systems of the present invention are suitable for use with a wide variety of EDA tools and methodologies for programming a device. Therefore, the described embodiments should be taken as illustrative and not restrictive, and the invention should not be limited to the details given herein but should be defined by the following claims and their full scope of equivalents.

What is claimed is:

1. A method of providing compilable variations of parameterized functional blocks for electronic designs, the parameterized functional blocks requiring specific settings before they can be compiled to unambiguous circuit blocks forming parts of electronic designs, the method comprising:

receiving a first set of option settings containing user-selected settings for a first parameterized functional block;

generating a first compilable variation file specifying the first set of option settings;

receiving a second set of option settings containing user-selected settings for a second parameterized functional block; and generating a second compilable variation file specifying the second set of option settings, wherein when the first variation file is compiled with the first parameterized functional block, a first unambiguous circuit block is formed and when the second variation file is compiled with the second parameterized functional block, a second unambiguous circuit block is formed.

2. The method of claim 1, further comprising compiling the first and second variation files with the first and second parameterized functional blocks.

3. The method of claim 1, wherein the option settings include one or more of parameter values, ports to use, and connections between two or more functional blocks.

4. The method of claim 1, wherein the option settings include sizes of a bus contained within a parameterized functional block.

5. The method of claim 1, wherein the variation files and the parameterized functional blocks are provided in a Hardware Description Language.

6. The method of claim 1, wherein the Hardware Description Language is VHDL, Verilog, or AHDL.

7. The method of claim 1, further comprising generating a first declaration file specifying an interface for user-specified variations of the first parameterized functional block.

8. The method of claim 1, wherein the first compilable variation file identifies the first parameterized functional block and maps variables from the first variation file to the first parameterized functional block.

9. The method of claim 1, wherein the first compilable variation file provides the first set of option settings in HDL code.

10. The method of claim 1, further comprising
compiling the first and second variation files with the first and second parameterized functional blocks; and
programming a programmable logic device with a compiled electronic design including the first set of options settings.

11. A programmable logic device produced by the method of claim 10.

12. A computer program product comprising a computer readable medium on which is stored program instructions for a method of providing a compilable variation of parameterized functional blocks for electronic designs, the parameterized functional blocks requiring specific settings before they can be compiled to unambiguous circuit blocks forming parts of electronic designs, the method comprising:

receiving a first set of option settings containing user-selected settings for a first parameterized functional block;

generating a first compilable variation file specifying the first set of option settings;

receiving a second set of option settings containing user-selected settings for a second parameterized functional block; and generating a second compilable variation file specifying the second set of option settings, wherein when the first variation file is compiled with the first parameterized functional block, a first unambiguous circuit block is formed and when the second variation file is compiled with the second parameterized functional block, a second unambiguous circuit block is formed.

13. The computer program product of claim 12, further comprising program instructions for compiling the first and second variation files with the first and second parameterized functional blocks.

14. The computer program product of claim 12, wherein the variation files and the parameterized functional blocks are provided in a Hardware Description Language.

15. An apparatus permitting a user to set options on a parameterized functional block for an electronic design, the parameterized functional block requiring specific settings before it can be compiled to an unambiguous circuit block forming a part of the electronic design, the apparatus comprising:

one or more processors;

memory coupled to the one or more processors to provide data and instructions to the processor; and a display coupled to at least one of the one or more processors, wherein the apparatus presents a prompt to a user on a user interface displayed on a display, the prompt requiring that the user selects or accepts settings for various options on the parameterized functional block, and wherein the one or more processors is configured to package the user's settings in a file that can be compiled or used to generate a compilable functional block in the electronic design;

wherein the file created by the apparatus contains handshaking information for communication between a first software entity that created the file and a second software entity that receives the file.

16. The apparatus of claim 15, wherein the second software entity converts information contained within the file to a compilable variation file.

17. An apparatus providing a compilable variation of parameterized functional blocks for electronic designs, the parameterized functional blocks requiring specific settings before they can be compiled to unambiguous circuit blocks forming parts of electronic designs, the apparatus comprising:

one or more processors; and memory coupled to the one or more processors to provide data and instructions to the processor, wherein the apparatus receives sets of options containing user-selected settings for various parameterized functional blocks, and wherein the apparatus generates separate compilable variation files specifying the sets of options for the various parameterized functional blocks.

18. The apparatus of claim 17, further comprising additional memory on which is stored a library of parameterized functional blocks.

19. The apparatus of claim 17, further comprising a compiler that compiles the various parameterized functional blocks with associated variation files to create electronic designs including the sets of options.

20. The apparatus of claim 17, wherein the sets of options include one or more of parameter values for the parameterized functional block, ports used in the parameterized functional block, and connections between two or more functional blocks.

21. The apparatus of claim 17, wherein the parameterized functional blocks are provided in one or more Hardware Description Languages.

22. A method of setting options for parameterized functional blocks relating to at least one electronic design, the parameterized functional blocks requiring specific settings before being compiled to unambiguous circuit blocks forming part of the at least one electronic design, the method comprising:
   prompting a user, via a user interface, to select settings for options;
   receiving sets of options containing user-selected settings for various parameterized functional blocks;
   packaging settings selected by the user in at least one file that can be compiled or used to generate at least one compilable functional block for the electronic design; and
   generating separate compilable variation files specifying the sets of options for the various parameterized functional blocks;
   wherein a first variation file is associated a first parameterized functional block, and a second variation file is associated a second parameterized functional block.

23. The method of claim 22 further comprising generating separate compilable declaration files specifying the sets of options for the various parameterized functional blocks.

24. The method of claim 22, further comprising providing the file to a compiler or an application that uses the settings contained in the file to generate the compilable functional block.

25. The method of claim 22, wherein the setting options include one or more of parameter values, ports to use in the parameterized functional block, and connections between two or more functional blocks.

26. The method of claim 25, wherein the setting options include multiple sizes for a bus contained within the parameterized functional block.

27. The method of claim 1, wherein the parameterized functional block is provided in a Hardware Description Language.

28. The method of claim 27, wherein the Hardware Description Language is VHDL, Verilog, or AHDL.

29. The method of claim 27, wherein the parameterized functional block contains a parameter block identifying parameters that can be set to specific values by the user.

30. The method of claim 22, wherein the user interface is a wizard.

31. The method of claim 22, wherein the user interface further allows the user to select one of two or more parameterized functional blocks that are interchangeable in the electronic design.

32. The method of claim 22, wherein the file contains a section identifying the parameterized functional block.

33. The method of claim 22, wherein the file includes data specifying a symbolic representation of the parameterized functional block with the user selected settings.

34. A computer program product for setting options for parameterized functional blocks relating to at least one electronic design, the parameterized functional blocks requiring specific settings before being compiled to unambiguous circuit blocks forming part of the at least one electronic design, the computer program product comprising:
   a computer usable medium having computer readable code embodied therein, the computer readable code comprising:
   computer code for prompting a user, via a user interface, to select settings for options;
   computer code for receiving sets of options containing user-selected settings for various parameterized functional blocks;
   computer code for packaging settings selected by the user in at least one file that can be compiled or used to generate compilable functional blocks for the electronic design; and
   computer code for generating separate compilable variation files specifying the sets of options for the various parameterized functional blocks;
   wherein a first variation file is associated a first parameterized functional block, and a second variation file is associated a second parameterized functional block.

35. The computer program product of claim 34 further comprising computer code for generating separate compilable declaration files specifying the sets of options for the various parameterized functional blocks.

36. The computer program product of claim 34, further comprising program instructions for providing the file to a compiler or an application that uses the settings contained in the file to generate the compilable functional block.

37. The computer program product of claim 1, wherein the parameterized functional block is provided in a Hardware Description Language.

38. An apparatus permitting a user to set options on a parameterized functional block for an electronic design, the parameterized functional block requiring specific settings before it can be compiled to an unambiguous circuit block forming a part of the electronic design, the apparatus comprising:
   one or more processors;
   memory coupled to the one or more processors to provide data and instructions to the processor; and
   a display coupled to at least one of the one or more processors, wherein the apparatus presents a prompt to a user on a user interface displayed on a display;
   the prompt requiring that the user selects or accepts settings for options on the parameterized functional block;
   wherein the one or more processors is configured to package the user's settings in a file that can be compiled or used to generate a compilable functional block in the electronic design; and
   wherein the one or more processors is configured to generate separate compilable declaration files specifying the set of options for the parameterized functional block.

39. The apparatus of claim 38, wherein the user interface presents a wizard.

40. The apparatus of claim 38, further comprising a compiler implemented with the one or more processors and memory.

41. The apparatus of claim 38, wherein the options include one or more of parameter values for the parameterized functional block, ports used in the parameterized functional block, and connections between two or more functional blocks.

42. The apparatus of claim 38, wherein the parameterized functional block is provided in a Hardware Description Language.

43. An apparatus providing a compilable variation of parameterized functional blocks for electronic designs, the parameterized functional blocks requiring specific settings before they can be compiled to unambiguous circuit blocks forming parts of electronic designs, the apparatus comprising:

one or more processors; and memory coupled to the one or more processors to provide data and instructions to the processor;

wherein the apparatus receives sets of options containing user-selected settings for various parameterized functional blocks; and wherein the apparatus generates separate compilable variation files specifying the sets of options for the various parameterized functional blocks;

wherein a first variation file is associated a first parameterized functional block, and a second variation is associated a second parameterized functional block.

44. The apparatus of claim 43, further comprising additional memory on which is stored a library of parameterized functional blocks.

45. The apparatus of claim 43, further comprising a compiler that compiles the various parameterized functional blocks with associated variation files to create electronic designs including the sets of options.

46. The apparatus of claim 43, wherein the sets of options include one or more of parameter values for the parameterized functional block, ports used in the parameterized functional block, and connections between two or more functional blocks.

47. The apparatus of claim 43, wherein the parameterized functional blocks are provided in one or more Hardware Description Languages.

48. The apparatus of claim 43, wherein the apparatus further generates separate compilable declaration files specifying the sets of options for the various parameterized functional blocks.

* * * * *